US008288259B2

(12) United States Patent
Okumura et al.

(10) Patent No.: US 8,288,259 B2
(45) Date of Patent: *Oct. 16, 2012

(54) PLASMA PROCESSING METHOD AND APPARATUS

(75) Inventors: Tomohiro Okumura, Kadoma (JP); Ichiro Nakayama, Kadoma (JP); Satoshi Maeshima, Kobe (JP); Bunji Mizuno, Ikoma (JP); Yuichiro Sasaki, Machida (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/950,048

(22) Filed: Nov. 19, 2010

(65) Prior Publication Data

US 2011/0081787 A1    Apr. 7, 2011

Related U.S. Application Data

(60) Division of application No. 11/517,456, filed on Sep. 8, 2006, now Pat. No. 7,858,537, which is a continuation of application No. 10/935,312, filed on Sep. 8, 2004, now Pat. No. 7,199,064.

(30) Foreign Application Priority Data

Sep. 8, 2003 (JP) ................................. 2003-315414

(51) Int. Cl.
*H01L 21/223* (2006.01)

(52) U.S. Cl. ... 438/530; 438/301; 438/795; 257/E21.143
(58) Field of Classification Search .................. 438/301, 438/530, 795
See application file for complete search history.

(56) References Cited

U.S. PATENT DOCUMENTS

| 4,912,065 | A | 3/1990 | Mizuno et al. |
| 5,242,539 | A | 9/1993 | Kumihashi et al. |
| 7,199,064 | B2 * | 4/2007 | Okumura et al. ............. 438/795 |

FOREIGN PATENT DOCUMENTS

| JP | 62-020306 | 1/1987 |
| JP | 01-129413 | 5/1989 |
| JP | 01-283919 | 11/1989 |
| JP | 9-115851 | 5/1997 |
| JP | 2000-090871 | 3/2000 |
| JP | 2000-114198 | 4/2000 |
| JP | 2000-299312 | 10/2000 |
| JP | 2002-170782 | 6/2002 |

* cited by examiner

*Primary Examiner* — Alexander Ghyka
(74) *Attorney, Agent, or Firm* — Wenderoth, Lind & Ponack, L.L.P.

(57) ABSTRACT

With the evacuation of an interior of a vacuum chamber halted and with gas supply into the vacuum chamber halted, in a state that a mixed gas of helium gas and diborane gas is sealed in the vacuum chamber, a plasma is generated in a vacuum vessel and simultaneously a high-frequency power is supplied to a sample electrode. By the high-frequency power supplied to the sample electrode, boron is introduced to a proximity to a substrate surface.

7 Claims, 14 Drawing Sheets

Fig.9

| STEP NO. | PRESSURE (Pa) | He FLOW RATE (sccm) | $B_2H_6$ FLOW RATE (sccm) | V·p/Q (s) | EVACUATION | HIGH-FREQUENCY POWER ICP/BIAS (W) |
|---|---|---|---|---|---|---|
| 1 | 3 | 50 | 3 | 1.3 | ON | 0/0 |
| 2 | 3 | 0 | 0 | - | OFF | 0/0 |
| 3 | 3 | 0 | 0 | - | OFF | 800/200 |

Fig.10

| STEP NO. | PRESSURE (Pa) | He FLOW RATE (sccm) | $B_2H_6$ FLOW RATE (sccm) | V·p/Q (s) | EVACUATION | HIGH-FREQUENCY POWER ICP/BIAS (W) |
|---|---|---|---|---|---|---|
| 1 | 3 | 100 | 6 | 0.64 | ON | 0/0 |
| 2 | 3 | 100 | 6 | - | OFF | 0/0 |
| 3 | 4 | 0 | 0 | - | OFF | 0/0 |
| 4 | 4 | 0 | 0 | - | OFF | 800/200 |

*Fig. 11*

| STEP NO. | PRESSURE (Pa) | He FLOW RATE (sccm) | $B_2H_6$ FLOW RATE (sccm) | V·p/Q (s) | EVACUATION | HIGH-FREQUENCY POWER ICP/BIAS (W) |
|---|---|---|---|---|---|---|
| 1 | 3 | 198 | 2 | 0.34 | ON | 0/0 |
| 2 | 3 | 0 | 0 | — | ON | 0/0 |
| 3 | 2 | 0 | 0 | — | OFF | 0/0 |
| 4 | 2 | 0 | 0 | — | OFF | 800/200 |

*Fig. 12B*

| STEP NO. | PRESSURE (Pa) | He FLOW RATE (sccm) | $B_2H_6$ FLOW RATE (sccm) | V·p/Q (s) | EVACUATION | HIGH-FREQUENCY POWER ICP/BIAS (W) |
|---|---|---|---|---|---|---|
| 1 | 3 | 7 | 3 | 6.7 | ON | 0/0 |
| 2 | 3 | 7 | 3 | 6.7 | ON | 800/200 |

PLASMA PROCESSING METHOD AND APPARATUS

This application is a Divisional of U.S. application Ser. No. 11/517,456, filed Sep. 8, 2006 now U.S. Pat. No. 7,858,537, which is a Continuation of U.S. application Ser. No. 10/935,312, filed Sep. 8, 2004, now U.S. Pat. No. 7,199,064.

BACKGROUND OF THE INVENTION

The present invention relates to plasma processing method and apparatus typified by plasma doping for introducing impurities to a surface of a solid sample of a semiconductor substrate or the like.

As the technique for introducing impurities to a surface of a solid sample, there has been known a plasma doping method for ionizing and introducing impurities into a solid with low energy (see, e.g., U.S. Pat. No. 4,912,065). FIG. 13 shows an outlined construction of a plasma processing apparatus to be used for the plasma doping method as a conventional impurity introduction method described in above-mentioned U.S. Pat. No. 4,912,065. Referring to FIG. 13, a sample electrode 206 for placing thereon a sample 209 formed of a silicon substrate is provided in a vacuum chamber 201. In the vacuum chamber 201 are provided a gas supply unit 202 for supplying a doping raw material gas containing desired elements, e.g., $B_2H_6$, and a pump 203 for pressure-reducing the interior of the vacuum chamber 201, by which the interior of the vacuum chamber 201 can be maintained at a specified pressure. From a microwaveguide 219, a microwave is radiated into the vacuum chamber 201 via a quartz plate 207 as a dielectric window. By interaction of this microwave and a dc magnetic field formed from an electromagnet 214, an effective-magnetic-field microwave plasma (electron cyclotron resonance plasma) 220 is formed in the vacuum chamber 201. A high-frequency power supply 210 is connected to the sample electrode 206 via a capacitor 221 so that voltage of the sample electrode 206 can be controlled. It is noted that the gas supplied from the gas supply unit 202 is introduced into the vacuum chamber 201 through a gas inlet 211, and discharged to the pump 203 through a gas outlet 212.

In a plasma processing apparatus of such a constitution, a doping raw material gas, e.g., $B_2H_6$, introduced through the gas inlet 211 is formed into a plasma by a plasma generation means composed of the microwaveguide 219 and the electromagnet 214, and boron ions in the plasma 220 are introduced to a surface of a sample 209 by the high-frequency power supply 210.

On the sample 209 to which impurities have been introduced in this way, forming a metal interconnection layer, then forming a thin oxide film on the metal interconnection layer in a specified oxidizing atmosphere and thereafter forming a gate electrode on the sample 209 by a CVD device or the like allows, for example, MOS transistors to be obtained.

In this connection, a gas containing impurities that will become electrically active when introduced to a sample of a silicon substrate or the like, like the doping raw material gas made of $B_2H_6$, generally has an issue of high danger.

Also, in the plasma doping method, all the substances contained in the doping raw material gas are introduced to the sample. Referring to a doping raw material gas made of $B_2H_6$ as an example, although boron is the only effective impurity when the material gas is introduced to the sample, hydrogen is also introduced into the sample at the same time. With hydrogen introduced into the sample, there is a problem that lattice defects would occur to the sample during subsequent heat treatment such as epitaxial growth.

Then, it is conceivable that an impurity solid containing impurities that will become electrically active when introduced into the sample 209 is arranged in the vacuum chamber 201 and a plasma of a rare gas is generated within the vacuum chamber 201, so that the impurity solid is sputtered by ions of inert gas to separate impurities from the impurity solid (See, for example, Japanese Unexamined Patent Publication No. 09-115851.). FIG. 14 shows a schematic construction of a plasma doping apparatus used in a plasma doping method serving as an impurity introducing method of the prior art described in Japanese Unexamined Patent Publication No. 09-115851. In FIG. 14, a sample electrode 206 for placing thereon a sample 209 formed of a silicon substrate is provided in a vacuum chamber 201. In the vacuum chamber 201 are provided a gas supply unit 202 for supplying an inert gas, and a pump 203 for pressure-reducing the interior of the vacuum chamber 201, by which the interior of the vacuum chamber 201 can be maintained at a specified pressure. From a microwaveguide 219, a microwave is radiated into the vacuum chamber 201 via a quartz plate 207 as a dielectric window. By interaction of this microwave and a dc magnetic field formed from an electromagnet 214, an effective-magnetic-field microwave plasma (electron cyclotron resonance plasma) 220 is formed in the vacuum chamber 201. A high-frequency power supply 210 is connected to the sample electrode 206 via a capacitor 221 so that voltage of the sample electrode 206 can be controlled. An impurity solid 222 containing impurity elements, e.g., boron, is provided on a solid holding table 223, and voltage of the solid holding table 223 is controlled by a high-frequency power supply 225 connected thereto via a capacitor 224. It is noted that the gas supplied from the gas supply unit 202 is introduced into the vacuum chamber 201 through a gas inlet 211, and discharged to the pump 203 through a gas outlet 212.

In a plasma doping apparatus of such a construction, an inert gas, e.g., argon (Ar), introduced from the gas inlet 211 is formed into a plasma by a plasma generation means composed of the microwaveguide 219 and the electromagnet 214, and a part of impurity elements that have come out of an impurity solid 222 into the plasma by sputtering are ionized and introduced to the surface of the sample 209.

However, with the conventional method, there has been a problem that it would be hard to attain uniform doping of impurities to the sample surface.

FIG. 15 shows results of measuring sheet resistance in the doping of boron to a 200 mm-dia. silicon semiconductor substrate 209, where an x-axis is taken from above to below of FIG. 13, in the conventional plasma processing apparatus shown in FIG. 13. As apparent from FIG. 15, the sheet resistance is higher on one side closer to the gas inlet 211 (upper side in FIG. 13) and lower on another side closer to the gas outlet 212 (lower side in FIG. 13). This could be attributed to nonuniformity of the ion density of boron as an impurity source that would be due to effects of nonuniformities of the gas flow, in other words, nonuniformity of pressure, nonuniformity of flow velocity, nonuniformity of boron partial pressure, and the like.

In view of the above issues of the prior art, an object of the present invention is to provide a plasma processing method and apparatus capable of enhancing the processing uniformities of doping concentration and the like.

SUMMARY OF THE INVENTION

In accomplishing the above object, the present invention has the following constitutions.

According to a first aspect of the present invention, there is provided a plasma processing method for introducing impurities into a sample or a film of a surface of the sample, the method comprising:

placing the sample on a sample electrode within a vacuum chamber;

supplying a gas into the vacuum chamber from a gas inlet of the vacuum chamber while evacuating the interior of the vacuum chamber through a gas outlet of the vacuum chamber;

setting a gas exhaust flow rate from within the vacuum chamber through the gas outlet to zero or substantially zero while setting a flow rate of the gas supply from the gas inlet to zero or substantially zero; and supplying a high-frequency power to a plasma source to generate a plasma in the vacuum chamber, thereby introducing the impurities into the sample or the film of the sample surface.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like.

According to a second aspect of the present invention, there is provided a plasma processing method for introducing impurities into a sample or a film of a surface of the sample, the method comprising:

placing the sample on a sample electrode within a vacuum chamber;

while evacuating the interior of the vacuum chamber through a gas outlet of the vacuum chamber, supplying a gas into the vacuum chamber from a gas inlet of the vacuum chamber which is so provided that a shortest flow passage connecting the gas outlet and the gas inlet of the vacuum chamber to each other avoids an upward space of the sample surface, by which a flow of the gas supplied into the vacuum chamber from the gas inlet of the vacuum chamber goes toward the gas outlet while avoiding the upward space of the sample surface;

setting an gas exhaust flow rate from within the vacuum chamber through the gas outlet to zero or substantially zero while setting a flow rate of the gas supply from the gas inlet to zero or substantially zero; and supplying a high-frequency power to a plasma source to generate a plasma in the vacuum chamber, thereby introducing the impurities into the sample or the film of the sample surface.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Also, since the flow of the gas supplied from the gas inlet of the vacuum chamber into the vacuum chamber comes to be directed toward the gas outlet while avoiding the upward space of the surface of the sample, plasma processing can be carried out without particles (dust) falling on the sample, making it possible to enhance the processing uniformity of doping concentration and the like.

According to a third aspect of the present invention, there is provided the plasma processing method as defined in the second aspect, wherein in, while evacuation is performed, supplying the gas into the vacuum chamber from the gas inlet which is so provided that the shortest flow passage connecting the gas outlet and the gas inlet to each other avoids the upward space of the sample surface, the gas is supplied into the vacuum chamber from the gas inlet that is provided at a site closer to the gas outlet than to the sample electrode.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Also, since the gas inlet is provided at a site closer to the gas outlet than to the sample electrode so that the flow of the gas supplied from the gas inlet of the vacuum chamber into the vacuum chamber is directed from the gas inlet toward the gas outlet without being directed toward the upward space of the surface of the sample, plasma processing can be carried out without particles (dust) falling on the sample.

According to a fourth aspect of the present invention, there is provided the plasma processing method as defined in the second aspect, wherein in, while evacuation is performed, supplying the gas into the vacuum chamber from the gas inlet which is so provided that the shortest flow passage connecting the gas outlet and the gas inlet to each other avoids the upward space of the sample surface, the gas is supplied into the vacuum chamber from the gas inlet that is provided at a site lower than the sample electrode.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site lower than the sample electrode, plasma processing can be carried out without particles (dust) falling on the sample.

According to a fifth aspect of the present invention, there is provided the plasma processing method as defined in the second aspect, wherein in, while evacuation is performed, supplying the gas into the vacuum chamber from the gas inlet which is so provided that the shortest flow passage connecting the gas outlet and the gas inlet to each other avoids the upward space of the sample surface, the gas is supplied from the gas inlet toward the gas outlet.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas is supplied from the gas inlet toward the gas outlet, plasma processing can be carried out without particles (dust) falling on the sample.

According to a sixth aspect of the present invention, there is provided the plasma processing method as defined in the second aspect, wherein in, while evacuation is performed, supplying the gas into the vacuum chamber from the gas inlet which is so provided that the shortest flow passage connecting the gas outlet and the gas inlet to each other avoids the upward space of the sample surface, the gas is supplied from the gas inlet toward an evacuator for performing the evacuation.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas is supplied from the gas inlet toward the evacuator, plasma processing can be carried out without particles (dust) falling on the sample.

According to a seventh aspect of the present invention, there is provided the plasma processing method as defined in the second aspect, wherein in, while evacuation is performed, supplying the gas into the vacuum chamber from the gas inlet which is so provided that the shortest flow passage connecting the gas outlet and the gas inlet to each other avoids the upward space of the sample surface, the gas is supplied into the vacuum chamber from the gas inlet provided at a site which is not exposed to the plasma even when the plasma is generated.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site where the gas inlet is not exposed to the plasma even in the step of generating a plasma, plasma processing can be carried out without particles (dust) falling on the sample.

According to an eighth aspect of the present invention, there is provided the plasma processing method as defined in the second aspect, wherein in, while evacuation is performed, supplying the gas into the vacuum chamber from the gas inlet which is so provided that the shortest flow passage connecting the gas outlet and the gas inlet to each other avoids the upward space of the sample surface, the gas is supplied from the gas inlet into the vacuum chamber while the gas inlet is shielded from the plasma by a shield plate placed in proximity to the gas inlet even when the plasma is generated.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site where the gas inlet is shielded from the plasma in the step of generating a plasma, plasma processing can be carried out without particles (dust) falling on the sample.

According to a ninth aspect of the present invention, there is provided a plasma processing method for introducing impurities into a sample or a film of a surface of the sample, the method comprising:

placing the sample on a sample electrode within a vacuum chamber;

evacuating interior of the vacuum chamber through a gas outlet of the vacuum chamber;

after setting a gas exhaust flow rate from within the vacuum chamber through the gas outlet to zero or substantially zero, supplying gas into the vacuum chamber from a gas inlet which is so provided that the shortest flow passage connecting the gas outlet and the gas inlet of the vacuum chamber to each other avoids an upward space of the sample surface, by which a flow of the gas supplied into the vacuum chamber from the gas inlet of the vacuum chamber is directed toward the gas outlet while avoiding the upward space of the sample surface;

setting the supply flow rate of the gas from the gas inlet to zero or substantially zero; and supplying a high-frequency power to a plasma source to generate a plasma in the vacuum chamber, thereby introducing the impurities into the sample or the film of the sample surface.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the flow of the gas supplied from the gas inlet of the vacuum chamber into the vacuum chamber is directed toward the gas outlet while avoiding the upward space of the surface of the sample, plasma processing can be carried out without particles (dust) falling on the sample.

According to a tenth aspect of the present invention, there is provided the plasma processing method as defined in the ninth aspect, wherein in, after setting the gas exhaust flow rate from within the vacuum chamber through the gas outlet to zero or substantially zero, supplying the gas into the vacuum chamber from the gas inlet which is so provided that the shortest flow passage connecting the gas outlet and the gas inlet to each other avoids the upward space of the sample surface, the gas is supplied into the vacuum chamber from the gas inlet provided at a site closer to the gas outlet than to the sample electrode.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site closer to the gas outlet than to the sample electrode, plasma processing can be carried out without particles (dust) falling on the sample.

According to an eleventh aspect of the present invention, there is provided the plasma processing method as defined in the ninth aspect, wherein in, after setting the gas exhaust flow rate from within the vacuum chamber through the gas outlet to zero or substantially zero, supplying the gas into the vacuum chamber from the gas inlet which is so provided that the shortest flow passage connecting the gas outlet and the gas inlet to each other avoids the upward space of the sample surface, the gas is supplied into the vacuum chamber from the gas inlet provided at a site lower than the sample electrode.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site lower than the sample electrode, plasma processing can be carried out without particles (dust) falling on the sample.

According to a twelfth aspect of the present invention, there is provided the plasma processing method as defined in the ninth aspect, wherein in, after setting the gas exhaust flow rate from within the vacuum chamber through the gas outlet to zero or substantially zero, supplying the gas into the vacuum chamber from the gas inlet which is so provided that the shortest flow passage connecting the gas outlet and the gas inlet to each other avoids the upward space of the sample surface, the gas is supplied from the gas inlet toward the gas outlet.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas is supplied from the gas inlet toward the gas outlet, plasma processing can be carried out without particles (dust) falling on the sample.

According to a thirteenth aspect of the present invention, there is provided the plasma processing method as defined in the ninth aspect, wherein in, after setting the gas exhaust flow rate from within the vacuum chamber through the gas outlet to zero or substantially zero, supplying the gas into the vacuum chamber from the gas inlet which is so provided that the shortest flow passage connecting the gas outlet and the gas inlet to each other avoids the upward space of the sample surface, the gas is supplied from the gas inlet toward an evacuator for performing the evacuation.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas is supplied from the gas inlet toward the evacuator, plasma processing can be carried out without particles (dust) falling on the sample.

According to a fourteenth aspect of the present invention, there is provided the plasma processing method as defined in the ninth aspect, wherein in, while evacuation is performed, supplying the gas into the vacuum chamber from the gas inlet which is so provided that the shortest flow passage connecting the gas outlet and the gas inlet to each other avoids the upward space of the sample surface, the gas is supplied into the vacuum chamber from the gas inlet provided at a site which is not exposed to the plasma even when the plasma is generated.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site where the gas inlet is not exposed to the plasma even in the step of generating a plasma, plasma processing can be carried out without particles (dust) falling on the sample.

According to a fifteenth aspect of the present invention, there is provided the plasma processing method as defined in the ninth aspect, wherein in, after setting the gas exhaust flow rate from within the vacuum chamber through the gas outlet to zero or substantially zero, supplying the gas into the vacuum chamber from the gas inlet which is so provided that the shortest flow passage connecting the gas outlet and the gas inlet to each other avoids the upward space of the sample surface, the gas is supplied into the vacuum chamber from the gas inlet provided at a site where the gas inlet is shielded from the plasma by a shield plate when the plasma is generated.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site where the gas inlet is shielded from the plasma in the step of generating a plasma, plasma processing can be carried out without particles (dust) falling on the sample.

According to a sixteenth aspect of the present invention, there is provided a plasma processing method for introducing impurities into a sample or a film of a surface of the sample, the method comprising:

placing the sample on a sample electrode within a vacuum chamber;

while evacuating the interior of the vacuum chamber through a gas outlet of the vacuum chamber, supplying a gas into the vacuum chamber from a gas inlet of the vacuum chamber;

given a volume V (L, liter) of the vacuum chamber, a pressure p (Torr) of the vacuum chamber interior and a flow rate Q (Torr·L/s) of the supplied gas, supplying a high-frequency power to a plasma source while a relationship that $V \cdot p/Q > 1$ (s) is satisfied, to generate a plasma in the vacuum chamber, thereby introducing the impurities into the sample or the film of the surface of the sample.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since reaction products are deposited less in vicinity of the gas inlet during the plasma generation, plasma processing can be carried out without particles (dust) falling on the sample.

According to a seventeenth aspect of the present invention, there is provided the plasma processing method as defined in the sixteenth aspect, wherein while the plasma is generated, a relationship that $V \cdot p/Q > 5 (s)$ is satisfied.

According to an eighteenth aspect of the present invention, there is provided a plasma processing apparatus comprising:

a vacuum vessel in which a vacuum chamber is formed and which has a gas outlet for evacuating the interior of the vacuum chamber, and a gas inlet which is so provided that a shortest flow passage connecting to the gas outlet avoids an upward space of a surface of the sample, the gas inlet serving for supplying a gas into the vacuum chamber;

a sample electrode for placing thereon the sample in the vacuum chamber;

an evacuator connected to the gas outlet of the vacuum vessel and serving for evacuating the interior of the vacuum chamber;

a gas supply unit connected to the gas inlet and serving for supplying the gas into the vacuum chamber;

a plasma source;

a high-frequency power supply for supplying a high-frequency power to the plasma source; and a control unit for, in a state that a flow rate of exhaust gas from within the vacuum chamber through the gas outlet has been set to zero or substantially zero and the gas supply flow rate from the gas inlet has been set to zero or substantially zero, supplying the high-frequency power to the plasma source to generate a plasma in the vacuum chamber, thereby exerting control so that impurities are introduced into the sample or a film of the surface of the sample.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the flow of the gas supplied from the gas inlet of the vacuum chamber into the vacuum chamber comes to be directed toward the gas outlet while avoiding the upward space of the surface of the sample, plasma processing can be carried out without particles (dust) falling on the sample, making it possible to enhance the processing uniformity of doping concentration and the like.

According to a nineteenth aspect of the present invention, there is provided the plasma processing apparatus as defined in the eighteenth aspect, wherein the gas inlet is provided at a site closer to the gas outlet than to the sample electrode.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site closer to the gas outlet than to the sample electrode, plasma processing can be carried out without particles (dust) falling on the sample.

According to a twentieth aspect of the present invention, there is provided the plasma processing apparatus as defined in the eighteenth aspect, wherein the gas inlet is provided at a site lower than the sample electrode.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site lower than the sample electrode, plasma processing can be carried out without particles (dust) falling on the sample.

According to a twenty-first aspect of the present invention, there is provided the plasma processing apparatus as defined in the eighteenth aspect, wherein the gas inlet is provided so as to blow out the gas toward the gas outlet.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas is supplied from the gas inlet toward the gas outlet, plasma processing can be carried out without particles (dust) falling on the sample.

According to a twenty-second aspect of the present invention, there is provided the plasma processing apparatus as defined in the eighteenth aspect, wherein the gas inlet is provided so as to blow out the gas toward the evacuator.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas is supplied from the gas inlet toward the evacuator, plasma processing can be carried out without particles (dust) falling on the sample.

According to a twenty-third aspect of the present invention, there is provided the plasma processing apparatus as defined in the eighteenth aspect, wherein the gas inlet is provided at a site which is not exposed to the plasma when the plasma is generated.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site where the gas inlet is not exposed to the plasma even in the step of generating a plasma, plasma processing can be carried out without particles (dust) falling on the sample.

According to a twenty-fourth aspect of the present invention, there is provided the plasma processing apparatus as defined in the eighteenth aspect, further comprising a shield plate for shielding the gas inlet from the plasma when the plasma is generated.

According to a twenty-fifth aspect of the present invention, there is provided the plasma processing apparatus as defined in the eighteenth aspect, wherein the sample electrode is arranged at a position nonuniform from an inner wall surface of the vacuum vessel.

With this constitution, since a plasma is generated in the vacuum chamber by supplying a high-frequency power to the plasma source in the state that the gas discharge flow rate is set to zero or substantially zero while the gas supply flow rate is set to zero or substantially zero, it becomes practicable to perform plasma processing without being affected by the gas flow, making it possible to enhance the processing uniformity of doping concentration and the like. Further, since the gas inlet is provided at a site where the gas inlet is shielded from the plasma in the step of generating a plasma, plasma processing can be carried out without particles (dust) falling on the sample.

As shown above, according to the plasma processing method and apparatus of the present invention, it becomes implementable to enhance the processing uniformity of doping concentration and the like without causing the occurrence of unwanted particles (dust).

BRIEF DESCRIPTION OF THE DRAWINGS

These and other aspects and features of the present invention will become clear from the following description taken in conjunction with the preferred embodiments thereof with reference to the accompanying drawings, in which:

FIG. 9 is a view showing a condition table with a 38 lit. vacuum chamber, which is a concrete example of the plasma doping apparatuses to be used respectively in the first, second, third, fourth, and fifth embodiments of the present invention;

FIG. 10 is a condition table with a 38 lit. vacuum chamber in a case which is a concrete example of the plasma doping apparatus to be used in the fifth embodiment of the present invention and in which evacuation is first halted and, simultaneously when 4 Pa is reached, gas supply is halted;

FIG. 11 is a condition table with a 38 lit. vacuum chamber in a case which is another concrete example of the plasma doping apparatus to be used in the fifth embodiment of the present invention and in which gas supply is first halted and, simultaneously when 2 Pa is reached, evacuation is halted;

FIG. 12B is a view showing a condition table with a 38 lit. vacuum chamber in a concrete example of the plasma doping apparatus to be used in the sixth embodiment of the present invention;

DETAILED DESCRIPTION OF THE PREFERRED EMBODIMENTS

Figure 1A:
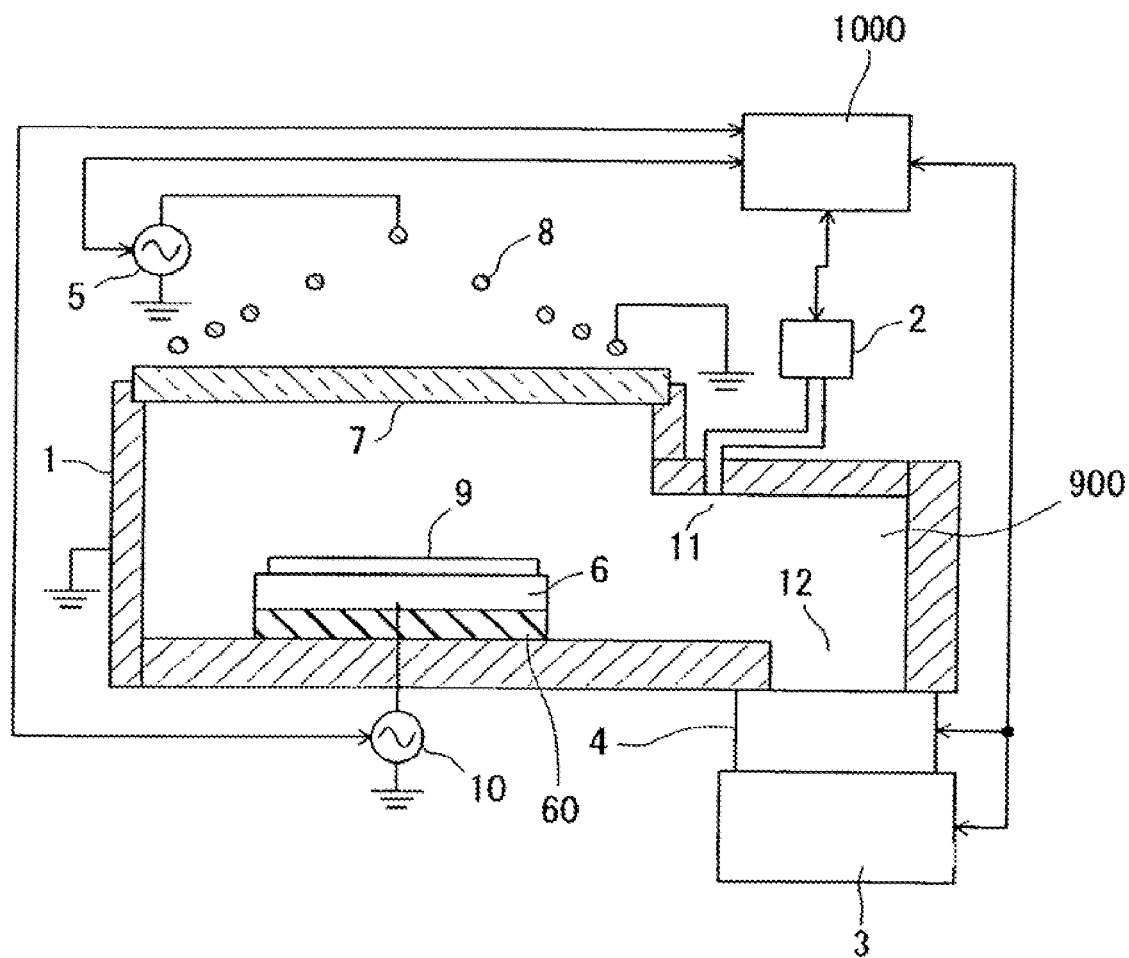
FIG. 1A is a cross-sectional side view showing a construction of a plasma doping apparatus to be used in a first embodiment of the present invention.

Before the description of the present invention proceeds, it is to be noted that like parts are designated by like reference numerals throughout the accompanying drawings.

Embodiments of the present invention are described below with reference to the accompanying drawings.

First Embodiment

A first embodiment of the present invention is described below with reference to FIG. 1A to FIG. 2.

Figure 1B:
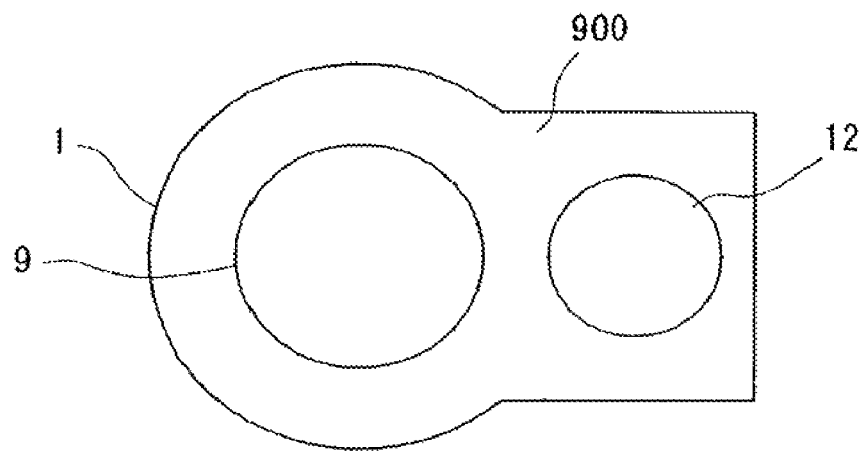
FIG. 1B is a plan view showing a configuration of a vacuum chamber and the like of the plasma doping apparatus to be used in the first embodiment.

FIG. 1A and FIG. 1B show a sectional view and a plan view of a plasma doping apparatus used in the first embodiment of the present invention, respectively. Referring to FIG. 1A, while a specified gas is introduced into a vacuum vessel 1, which forms a vacuum chamber 900 and which is grounded, from a gas supply unit 2 via a gas inlet 11 of the vacuum vessel 1, evacuation is performed via a gas outlet 12 of the vacuum vessel 1 by a turbo-molecular pump 3 as an example of an evacuator, by which the interior of the vacuum vessel 1 can be maintained at a specified pressure by a pressure regulating valve 4. By supplying a high-frequency power of 13.56 MHz as an example by a high-frequency power supply 5 to a coil 8 provided near an outer top face of a dielectric window 7 provided at an upper portion of the vacuum vessel 1 in confrontation to a sample electrode 6, an inductively coupled plasma can be generated in a space upward and around the sample electrode 6 of the vacuum chamber 900 in the vacuum vessel 1. A silicon substrate 9 as an example of the sample is placed on the sample electrode 6 set within the vacuum vessel 1 with an insulator 60 interposed.

Also, a high-frequency power supply 10 for supplying a high-frequency power to the sample electrode 6 is provided, and voltage of the sample electrode 6 can be controlled by a control unit 1000 so that the substrate 9 as an example of the sample has a negative voltage relative to the plasma.

The gas inlet 11 formed in the vacuum vessel 1 for supplying the gas from the gas supply unit 2 to the vacuum chamber 900 is provided downwardly at an upper portion of the vacuum vessel 1 near the gas outlet 12 and confronting the gas outlet 12 in such a manner that the shortest flow passage connecting the gas outlet 12 and the gas inlet 11 of the vacuum chamber 900 to each other avoids an upward space of a surface of the silicon substrate 9 as an example of the sample (i.e., upward space of the sample electrode 6 in this first embodiment). Therefore, the gas supplied from the gas supply unit 2 is supplied to the vacuum chamber 900 within the vacuum vessel 1 from the gas inlet 11 provided at a site closer to the gas outlet 12 than to the sample electrode 6, and the supplied gas is discharged to the pump 3 from the gas outlet 12 without being directed toward the upward space of the sample electrode 6. That is, the supplied gas flows finally in all to the pump 3 through the gas outlet 12.

The control unit 1000 controls operations of the gas supply unit 2, the turbo-molecular pump 3, the pressure regulating valve 4, the high-frequency power supply 5, and the high-frequency power supply 10 as will be described later.

Figure 1C:
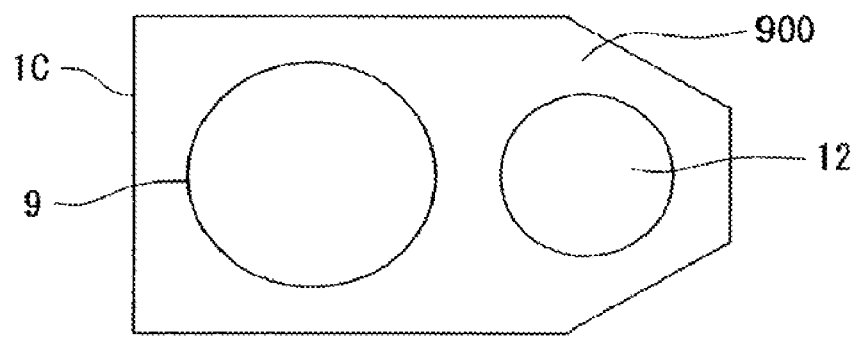
FIG. 1C is a plan view showing a configuration of a vacuum chamber and the like of a plasma doping apparatus according to a modification of the first embodiment.
Figure 1D:
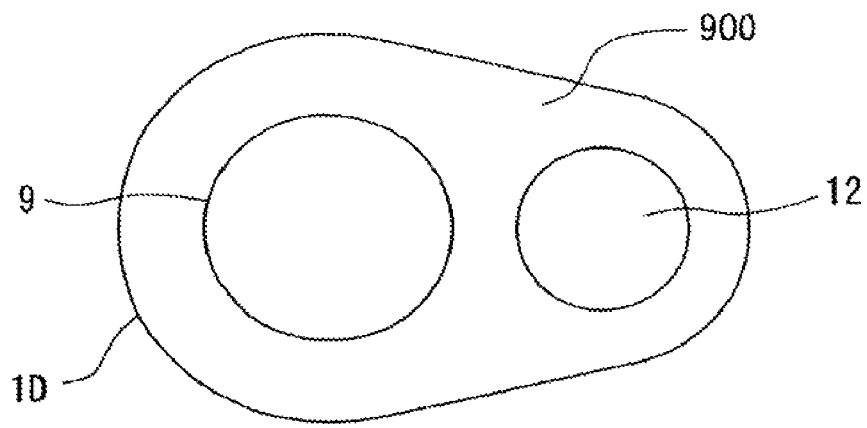
FIG. 1D is a plan view showing a configuration of a vacuum chamber and the like of a plasma doping apparatus according to another modification of the first embodiment.

As to the inner-wall configuration of the vacuum vessel 1, i.e., the configuration of the vacuum chamber 900, the periphery at the sample electrode 6 is formed into a circular shape as shown in FIG. 1B, and the periphery at the gas outlet 12 is formed into a rectangular shape. However, the vacuum chamber 900 is not limited to such configurations. For example, as to the configuration of the vacuum chamber 900 of a vacuum vessel 1C, as shown in FIG. 1C, it is also possible that the periphery at the sample electrode 6 is formed into a rectangular shape while the periphery at the gas outlet 12 is formed into a trapezoidal shape. Also, as to the configuration of the vacuum chamber 900 of a vacuum chamber 1D, as shown in FIG. 1D, it is also possible that the periphery at the sample electrode 6 is formed into a large circular shape while the periphery at the gas outlet 12 is formed into a small circular shape. In either case, the sample electrode 6 is positioned nonuniformly from the inner wall surface of the vacuum vessel 1.

After the placement of the substrate 9 on the sample electrode 6, while the vacuum chamber 900 is evacuated through the gas outlet 12 with the sample electrode 6 held at a temperature of, for example, 10° C., 50 sccm of helium gas as an example and 3 sccm of diborane ($B_2H_6$) gas as an example of the doping raw material gas are supplied to the vacuum chamber 900 through the gas inlet 11, where the vacuum chamber 900 is held at a pressure of, for example, 3 Pa by controlling the pressure regulating valve 4.

Next, nearly simultaneously when the evacuation is halted or nearly halted (i.e., the discharge gas flow rate is set to zero or substantially zero), gas supply is halted or nearly halted (i.e., the gas supply flow rate is set to zero or substantially zero), by which the mixed gas of, for example, helium gas and diborane gas, is enclosed in the vacuum chamber 900 at 3 Pa.

Next, in a state that there is no or substantially no gas flow as shown above, a high-frequency power of, for example, 800 W is supplied to the coil 8 that is an example of a plasma source, thereby generating a plasma in the vacuum chamber 900, while a high-frequency power of, for example, 200 W is supplied to the sample electrode 6. In this way, boron was able to be introduced to a vicinity of the surface of the substrate 9.

Figure 2:
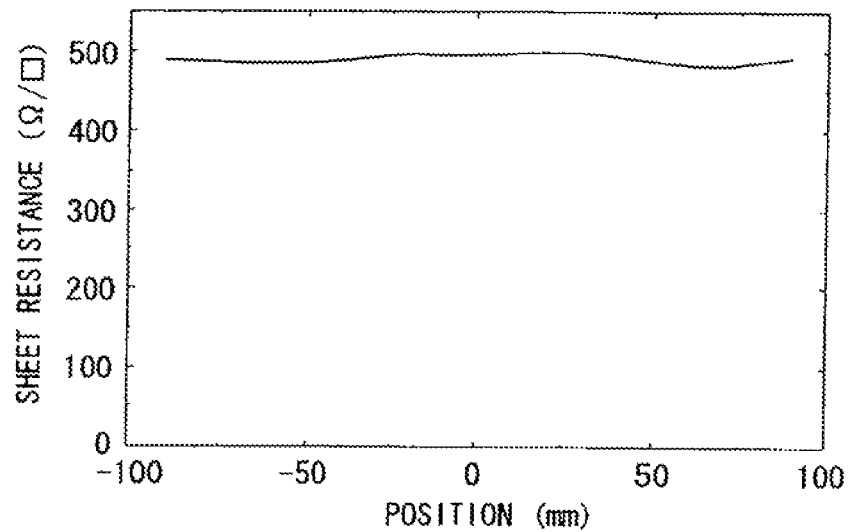
FIG. 2 is a view showing sheet resistance measurement results in the first embodiment of the present invention.

FIG. 2 charts positions of a substrate versus sheet resistance measurement results at the positions in doping of boron into the substrate, which is a 200 mm-dia. silicon semiconductor substrate, where an x-axis is taken from left to right in FIG. 1A. As apparent from FIG. 2, the in-plane distribution of sheet resistance was greatly uniformized, compared with the prior art example.

This could be attributed to the reason that nonuniformity of ion density of boron, which was an example of an impurity source, due to the effects of nonuniformity of pressure, nonuniformity of flow velocity, nonuniformity of boron partial pressure, and the like as would be seen in the prior art was reduced by generating a plasma in a state in which there was no gas flow, so that the doping process was able to be done without being affected by the gas flow.

Now the arrangement of the gas inlet 11 is explained.

Figure 3:
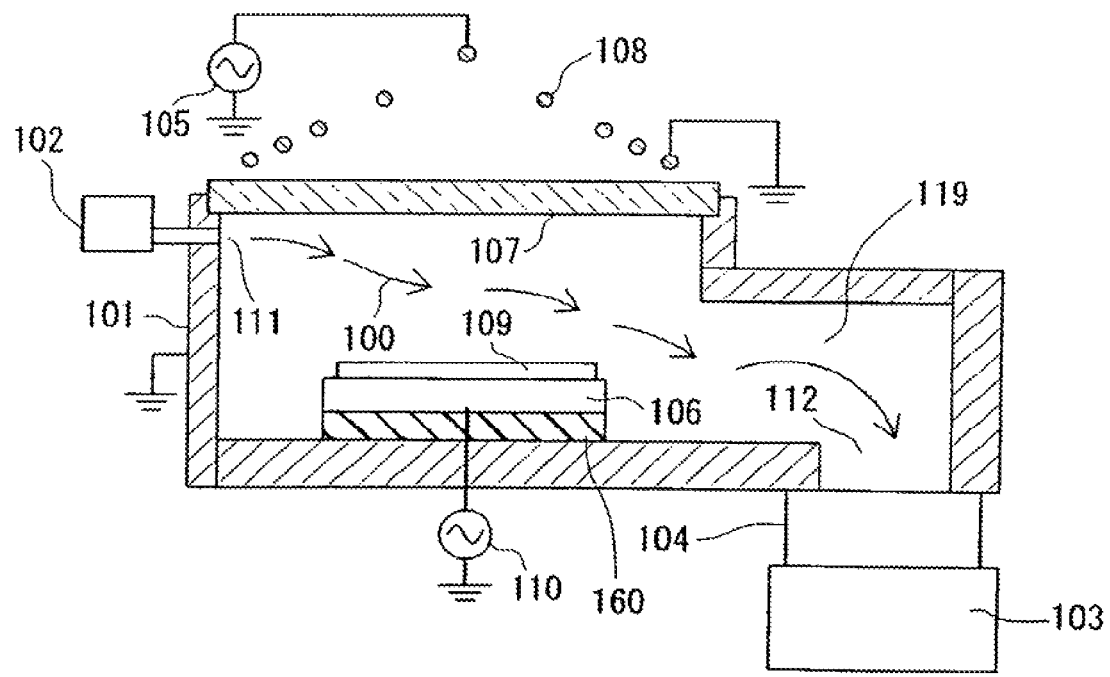
FIG. 3 is a sectional view showing a construction of a conventional plasma doping apparatus to be used in the explanation of the first embodiment of the present invention.

First of all, for comparison's sake, as shown in FIG. 3 as an example in which the gas flow did not avoid the upward space of the sample electrode, in a case of a conventional plasma doping apparatus where a gas inlet 111 was provided at a site higher than a sample electrode 106 and farther from a gas outlet 112 than the sample electrode 106 and where boron was introduced to a vicinity of a surface of a sample 109 by generating a plasma with a gas flow maintained, the in-plane distribution of sheet resistance was as successful as in the case where the apparatus of FIG. 1A of the first embodiment was used, whereas particles (dust) fell on the sample 109, resulting in a sharp decrease of device yield. It is noted that referring to FIG. 3, reference numeral 100 denotes a gas flow from the gas inlet 111 to the gas outlet 112, 101 denotes a vacuum vessel, 102 denotes a gas supply unit, 103 denotes a turbo-molecular pump, 104 denotes a pressure regulating valve, 105 denotes a high-frequency power supply, 107 denotes a dielectric window, 108 denotes a coil, 110 denotes a high-frequency power supply, 160 denotes an insulator, and 119 denotes a vacuum chamber.

On the other hand, in the case where the apparatus of FIG. 1A of the first embodiment was used, particles (dust) did not fall on the sample 9, and high yield was obtained. Also in the prior-art processing in which gas supply and discharge is not halted, particles (dust) did not fall on the sample 9. The reason of such a result is as follows. That is, when a plasma is generated with a gas supply through the gas inlet 11, vicinities of the gas inlet 11 are high in pressure and high in flow velocity locally, thus resulting in quite a low plasma density. As a result, there occurs no deposition of reaction products near the gas inlet 11. However, if a plasma is generated with the gas supply halted or nearly halted, there would be deposited reaction products even near the gas inlet 11. When the gas supply is resumed with reaction products deposited near the gas inlet 11, a thin film formed of the deposited reaction products by the gas flow would be peeled off, falling on the substrate 9 as particles.

In the apparatus of FIG. 1A, since the gas inlet 11 is provided at a site higher than the sample electrode 6 and closer to the gas outlet 12 than to the sample electrode 6, generated particles are accelerated, riding on the gas flow, to flow toward the gas outlet 12 rather than toward the sample electrode 6 so as to avoid the upward space of the sample electrode. This could account for the particles not having fallen toward the substrate 9.

Thus, according to the first embodiment, since the plasma is generated in the vacuum chamber 900 by supplying a high-frequency power while the gas supply is halted or nearly halted nearly simultaneously with a halt or nearly halt of the evacuation, it becomes practicable to perform plasma processing without being affected by the gas flow, making it possible to enhance the processing uniformity of doping concentration and the like. Also, since the gas inlet 11 is provided at a site closer to the gas outlet 12 than to the sample electrode 6, plasma processing can be carried out without particles (dust) falling on the silicon substrate 9 as an example of the sample.

In order to verify the mechanism described above, various actual examples as to the arrangement of the gas inlet 11 will be described by way of embodiments.

Second Embodiment

A second embodiment of the present invention is described below with reference to FIG. 4.

Figure 4:
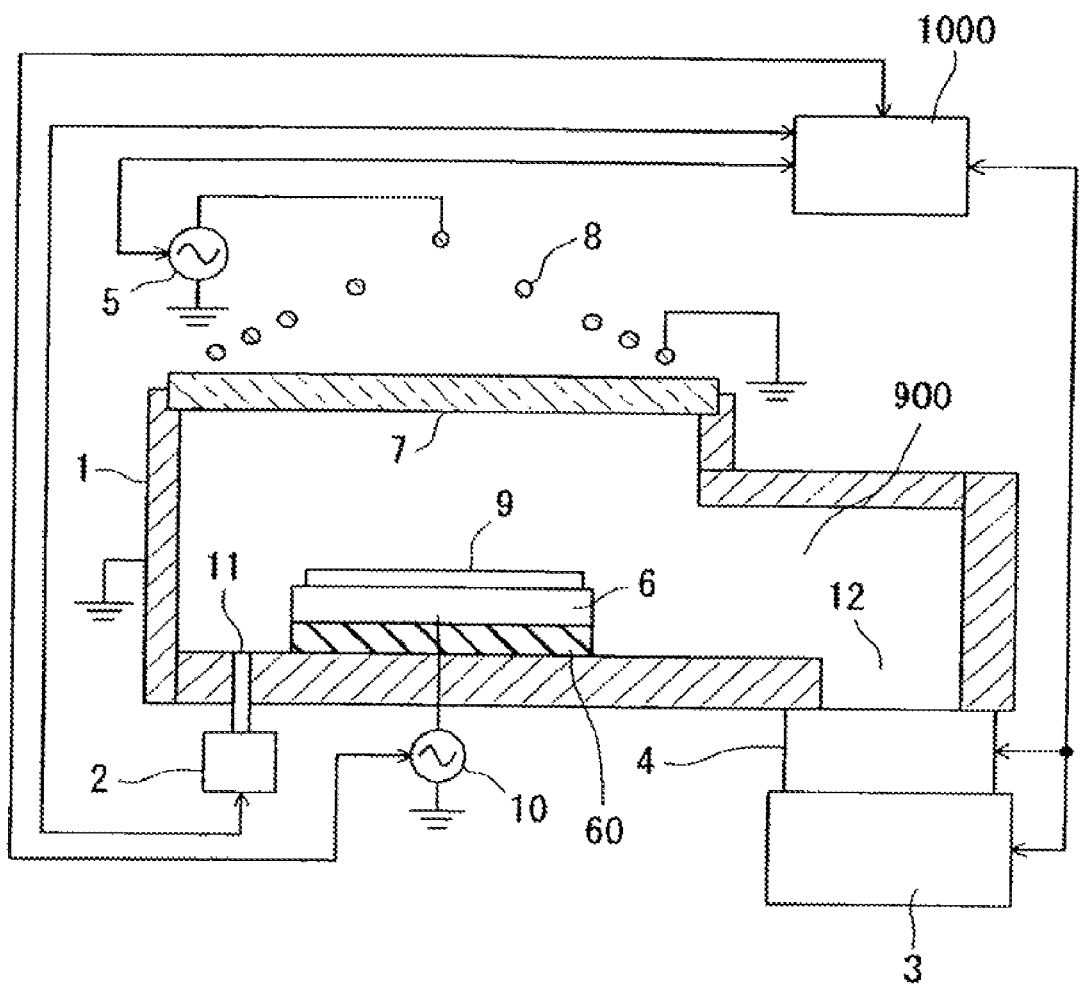
FIG. 4 is a sectional view showing a construction of a plasma doping apparatus to be used in a second embodiment of the present invention.

FIG. 4 shows a sectional view of a plasma doping apparatus to be used in the second embodiment of the present invention. Referring to FIG. 4, while a specified gas is introduced into a vacuum vessel 1, which forms a vacuum chamber 900 and which is grounded, from a gas supply unit 2 via a gas inlet 11 of the vacuum vessel 1, evacuation is performed via a gas outlet 12 of the vacuum vessel 1 by a turbo-molecular pump 3 as an example of the evacuator, by which the interior of the vacuum vessel 1 can be maintained at a specified pressure by a pressure regulating valve 4. By supplying a high-frequency power of 13.56 MHz as an example by a high-frequency power supply 5 to a coil 8 provided near an outer top face of a dielectric window 7 provided at an upper portion of the vacuum vessel 1 in confrontation to a sample electrode 6, an inductively coupled plasma can be generated in an upward space and around the space of the sample electrode 6 of the vacuum chamber 900 in the vacuum vessel 1. A silicon substrate 9 as an example of the sample is placed on the sample electrode 6 set within the vacuum vessel 1 with an insulator 60 interposed.

Also, a high-frequency power supply 10 for supplying a high-frequency power to the sample electrode 6 is provided, and voltage of the sample electrode 6 can be controlled by a control unit 1000 so that the substrate 9 as an example of the sample has a negative voltage relative to the plasma.

The gas inlet 11 formed in the vacuum vessel 1 for supplying the gas from the gas supply unit 2 to the vacuum chamber 900 is provided at a site on a bottom face of the vacuum vessel 1 and on one side of the sample electrode 6 opposite to the gas outlet 12 (at a site on the left side of the sample electrode 6 in FIG. 4) in such a manner that the shortest flow passage connecting the gas outlet 12 and the gas inlet 11 of the vacuum chamber 900 to each other avoids an upward space of a surface of the silicon substrate 9 as an example of the sample (i.e., upward space of the sample electrode 6 in this second embodiment). Therefore, the gas supplied from the gas supply unit 2 is introduced into the vacuum chamber 900 within the vacuum vessel 1 from the gas inlet 11 provided at a site lower than the sample electrode 6, more specifically, at the site on the bottom face of the vacuum vessel 1 and on the one side of the sample electrode 6 opposite to the gas outlet 12, and the supplied gas is passed downside of the periphery of the sample electrode 6 so as to be directed toward the gas outlet 12 without being directed toward the upward space of the sample electrode 6, and then discharged to the pump 3 from the gas outlet 12.

The control unit 1000 controls operations of the gas supply unit 2, the turbo-molecular pump 3, the pressure regulating valve 4, the high-frequency power supply 5, and the high-frequency power supply 10 as shown below.

After the placing of the substrate 9 on the sample electrode 6, while the vacuum chamber 900 is evacuated through the gas outlet 12 with the sample electrode 6 held at a temperature of, for example, 10° C., 50 sccm of helium gas as an example and 3 sccm of diborane ($B_2H_6$) gas as an example of the doping raw material gas are supplied into the vacuum chamber 900 through the gas inlet 11, where the internal pressure of the vacuum chamber 900 is held at a pressure of, for example, 3 Pa by controlling the pressure regulating valve 4.

Next, nearly simultaneously when the evacuation is halted or nearly halted (i.e., the discharge gas flow rate is set to zero or substantially zero), gas supply is halted or nearly halted (i.e., the gas supply flow rate is set to zero or substantially zero), thereby creating a state that there is no or substantially no gas flow, i.e., a state that the mixed gas of, for example, helium gas and diborane gas is enclosed in the vacuum chamber 900 at 3 Pa.

Next, in the state that there is no or substantially no gas flow as shown above, a high-frequency power of, for example, 800 W is supplied to the coil 8 that is an example of the plasma source, thereby generating a plasma in the vacuum chamber 900, while a high-frequency power of, for example, 200 W is supplied to the sample electrode. In this way, boron was able to be introduced to a vicinity of the surface of the substrate 9.

In this case also, the in-plane distribution of sheet resistance was greatly uniformized, compared with the prior art example. This could be attributed to the reason that nonuniformity of ion density of boron, which was an example of the impurity source, due to the effects of nonuniformity of pressure, nonuniformity of flow velocity, nonuniformity of boron partial pressure, and the like as would be seen in the prior art was reduced by generating a plasma in a state in which there was no or substantially no gas flow, so that the doping process was able to be done without being affected by the gas flow.

Also, by virtue of the plasma being generated with the gas supply halted or nearly halted, although there occurred reaction products even near the gas inlet 11, the amount of the deposited reaction products was quite smaller than that of the prior art because of the provision of the gas inlet 11 at a site lower than the sample electrode 6 (in a region of lower plasma density) in the apparatus of FIG. 4. As a result, particles did not fall on the substrate 9.

Therefore, according to the second embodiment, since the plasma is generated in the vacuum chamber 900 by supplying a high-frequency power while the gas supply is halted or nearly halted nearly simultaneously with a halt or nearly halt of the evacuation, it becomes practicable to perform plasma processing without being affected by the gas flow, making it possible to enhance the processing uniformity of doping concentration and the like. Also, since the gas inlet 11 is provided at the site lower than the sample electrode 6, plasma processing can be carried out without particles (dust) falling on the silicon substrate 9 as an example of the sample.

Third Embodiment

A third embodiment of the present invention is described below with reference to FIG. 5.

Figure 5:
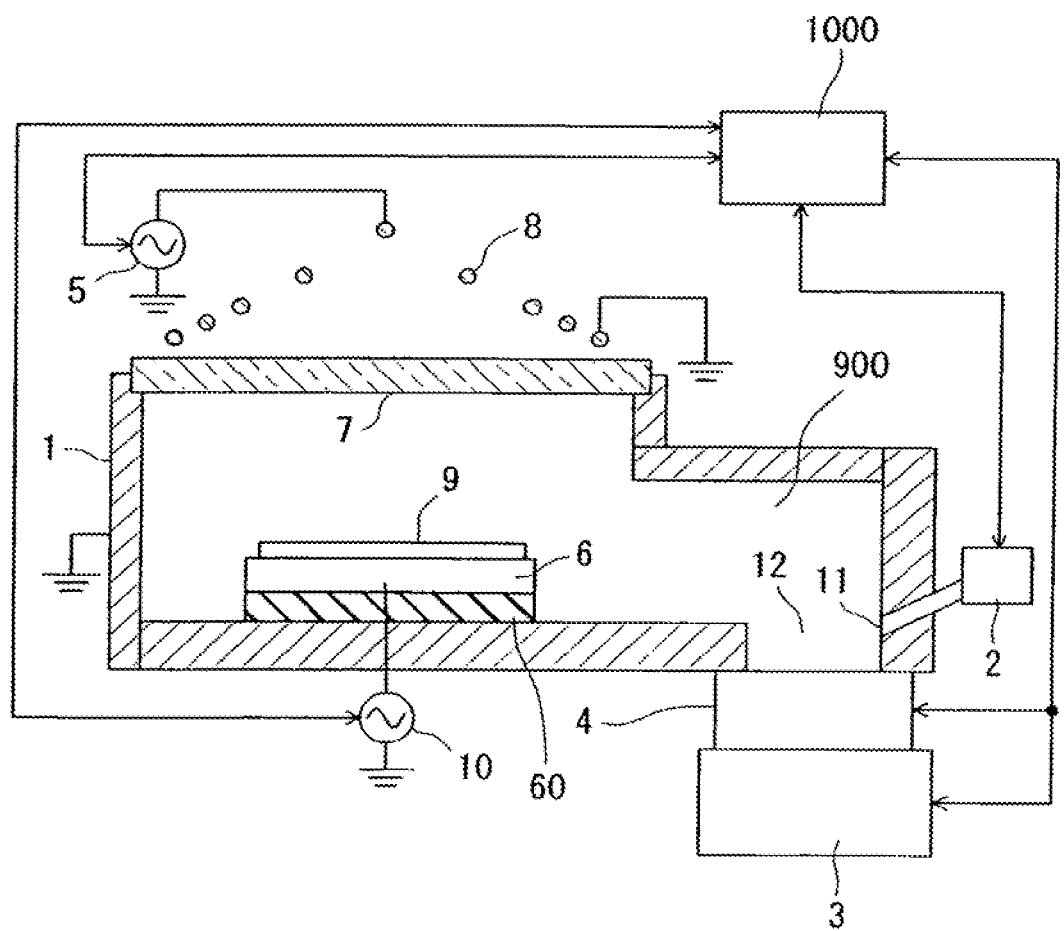
FIG. 5 is a sectional view showing a construction of a plasma doping apparatus to be used in a third embodiment of the present invention.

FIG. 5 shows a sectional view of a plasma doping apparatus to be used in the third embodiment of the present invention. Referring to FIG. 5, while a specified gas is introduced into a vacuum vessel 1, which forms a vacuum chamber 900 and which is grounded, from a gas supply unit 2 via a gas inlet 11 of the vacuum vessel 1, evacuation is performed via a gas outlet 12 of the vacuum vessel 1 by a turbo-molecular pump 3 as an example of the evacuator, by which the interior of the vacuum vessel 1 can be maintained at a specified pressure by a pressure regulating valve 4. By supplying a high-frequency power of 13.56 MHz as an example by a high-frequency power supply 5 to a coil 8 provided near a dielectric window 7 provided at an upper portion of the vacuum vessel 1 in confrontation to a sample electrode 6, an inductively coupled plasma can be generated in an upward space and around the space of the sample electrode 6 of the vacuum chamber 900 in the vacuum vessel 1. A silicon substrate 9 as an example of the sample is placed on the sample electrode 6 set within the vacuum vessel 1 with an insulator 60 interposed.

Also, a high-frequency power supply 10 for supplying a high-frequency power to the sample electrode 6 is provided, and voltage of the sample electrode 6 can be controlled by a control unit 1000 so that the substrate 9 as an example of the sample has a negative voltage relative to the plasma.

The gas inlet 11 formed in the vacuum vessel 1 for supplying the gas from the gas supply unit 2 to the vacuum chamber 900 is provided near the gas outlet 12 at the vacuum chamber 900 so as to be directed toward the gas outlet 12 in such a manner that the shortest flow passage connecting the gas outlet 12 and the gas inlet 11 of the vacuum chamber 900 to each other avoids an upward space of a surface of the silicon substrate 9 as an example of the sample (i.e., upward space of the sample electrode 6 in this third embodiment). Therefore, the gas supplied from the gas supply unit 2 is introduced into the vacuum chamber 900 within the vacuum vessel 1 from the gas inlet 11 provided near the gas outlet 12 toward the gas outlet 12, and the supplied gas is discharged to the pump 3 from the gas outlet 12 without being directed toward the upward space of the sample electrode 6.

The control unit 1000 controls operations of the gas supply unit 2, the turbo-molecular pump 3, the pressure regulating valve 4, the high-frequency power supply 5, and the high-frequency power supply 10 as shown below.

After the placing of the substrate 9 on the sample electrode 6, while the vacuum chamber 900 is evacuated through the gas outlet 12 with the sample electrode 6 held at a temperature of, for example, 10° C., 50 sccm of helium gas as an example and 3 sccm of diborane ($B_2H_6$) gas as an example of the doping raw material gas are supplied into the vacuum chamber 900 through the gas inlet 11, where the internal pressure of the vacuum chamber 900 is held at a pressure of, for example, 3 Pa by controlling the pressure regulating valve 4.

Next, nearly simultaneously when the evacuation is halted or nearly halted (i.e., the discharge gas flow rate is set to zero or substantially zero), gas supply is halted or nearly halted (i.e., the gas supply flow rate is set to zero or substantially zero), thereby creating a state that there is no or substantially no gas flow, i.e., a state that the mixed gas of, for example, helium gas and diborane gas is enclosed in the vacuum chamber 900 at 3 Pa.

Next, in a state that there is no or substantially no gas flow as shown above, a high-frequency power of, for example, 800 W is supplied to the coil 8 that is an example of the plasma source, thereby generating a plasma in the vacuum chamber 900, while a high-frequency power of, for example, 200 W is supplied to the sample electrode. In this way, boron was able to be introduced to a vicinity of the surface of the substrate 9.

In this case also, the in-plane distribution of sheet resistance was greatly uniformized, compared with the prior art example. This could be attributed to the reason that nonuniformity of ion density of boron, which was an example of the impurity source, due to the effects of nonuniformity of pressure, nonuniformity of flow velocity, nonuniformity of boron partial pressure, and the like as would be seen in the prior art was reduced by generating a plasma in a state in which there was no or substantially no gas flow, so that the doping process was able to be done without being affected by the gas flow.

Also, since the plasma was generated with the gas supply halted or nearly halted, there would be deposited reaction products even near the gas inlet 11, and a thin film formed of the reaction products deposited by the gas flow would be peeled off upon resumption of the gas supply. However, in the apparatus of FIG. 5, since the gas inlet 11 was provided so as to be directed toward the gas outlet 12, particles did not fall on the substrate 9. Further, also in the step of generating a plasma, since the gas inlet 11 was placed at a site where the gas inlet 11 would not be exposed to the plasma, there occurred almost no deposition of reaction products near the gas inlet 11 in the plasma generation, with the discharged particles dramatically reduced, so that a stabler plasma doping process was able to be carried out.

Therefore, according to the third embodiment, since the plasma is generated in the vacuum chamber 900 by supplying a high-frequency power to the a coil 8 that is an example of the plasma source while the gas supply flow rate is set to zero (halt) or substantially zero (substantially halt) along with a setting of the gas discharge flow rate to zero (halt) or substantially zero (substantially halt), it becomes practicable to perform plasma processing without being affected by the gas flow, making it possible to enhance the processing uniformity of doping concentration and the like. Also, since the gas is supplied from the gas inlet 11 toward the gas outlet 12, plasma processing can be carried out without particles (dust) falling on the silicon substrate 9 as an example of the sample.

Fourth Embodiment

A fourth embodiment of the present invention is described below with reference to FIG. 6.

Figure 6:
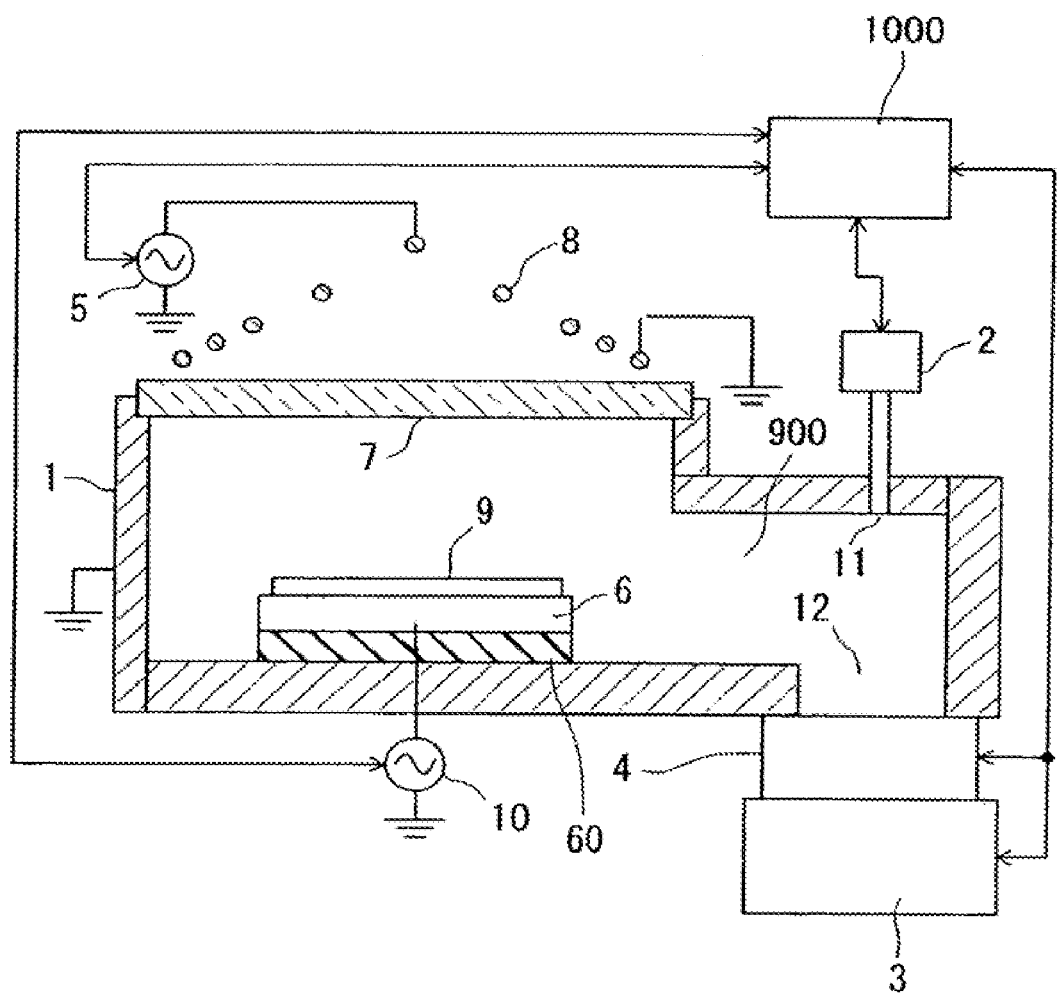
FIG. 6 is a sectional view showing a construction of a plasma doping apparatus to be used in a fourth embodiment of the present invention.

FIG. 6 shows a sectional view of a plasma doping apparatus to be used in the fourth embodiment of the present invention. Referring to FIG. 6, while a specified gas is introduced into a vacuum vessel 1, which forms a vacuum chamber 900 and which is grounded, from a gas supply unit 2 via a gas inlet 11 of the vacuum vessel 1, evacuation is performed via a gas outlet 12 of the vacuum vessel 1 by a turbo-molecular pump 3 as an example of the evacuator, by which the interior of the vacuum vessel 1 can be maintained at a specified pressure by a pressure regulating valve 4. By supplying a high-frequency power of 13.56 MHz as an example by a high-frequency power supply 5 to a coil 8 provided near an outer top face of a dielectric window 7 provided at an upper portion of the vacuum vessel 1 in confrontation to a sample electrode 6, an inductively coupled plasma can be generated in an upward space and around the space of the sample electrode 6 of the vacuum chamber 900 in the vacuum vessel 1. A silicon substrate 9 as an example of the sample is placed on the sample electrode 6 set within the vacuum vessel 1 with an insulator 60 interposed.

Also, a high-frequency power supply 10 for supplying a high-frequency power to the sample electrode 6 is provided, and voltage of the sample electrode 6 can be controlled by a control unit 1000 so that the substrate 9 as an example of the sample has a negative voltage relative to the plasma.

The gas inlet 11 formed in the vacuum vessel 1 for supplying the gas from the gas supply unit 2 to the vacuum chamber 900 is provided at a position near the gas outlet 12 and opposite to the gas outlet 12 in an upper portion of the vacuum vessel 1 confronting the gas outlet 12 so as to be directed toward the gas outlet 12 in such a manner that the shortest flow passage connecting the gas outlet 12 and the gas inlet 11 of the vacuum chamber 900 to each other avoids an upward space of a surface of the silicon substrate 9 as an example of the sample (i.e., upward space of the sample electrode 6 in this fourth embodiment). Therefore, the gas supplied from the gas supply unit 2 is introduced into the vacuum chamber 900 from the gas inlet 11 provided near the gas outlet 12 toward the turbo-molecular pump 3, and the supplied gas is discharged to the pump 3 from the gas outlet 12 without being directed toward the upward space of the sample electrode 6.

The control unit 1000 controls operations of the gas supply unit 2, the turbo-molecular pump 3, the pressure regulating valve 4, the high-frequency power supply 5, and the high-frequency power supply 10 as shown below.

After the placing of the substrate 9 on the sample electrode 6, while the vacuum chamber 900 is evacuated through the gas outlet 12 with the sample electrode 6 held at a temperature of, for example, 10° C., 50 sccm of helium gas as an example and 3 sccm of diborane ($B_2H_6$) gas as an example of the doping raw material gas are supplied into the vacuum chamber 900 through the gas inlet 11, where the internal pressure of the vacuum chamber 900 is held at a pressure of, for example, 3 Pa by controlling the pressure regulating valve 4.

Next, nearly simultaneously when the evacuation is halted or nearly halted (i.e., the discharge gas flow rate is set to zero or substantially zero), gas supply is halted or nearly halted (i.e., the gas supply flow rate is set to zero or substantially zero), thereby creating a state that there is no or substantially no gas flow, i.e., a state that the mixed gas of, for example, helium gas and diborane gas is enclosed in the vacuum chamber 900 at 3 Pa.

Next, in the state that there is no or substantially no gas flow as shown above, a high-frequency power of, for example, 800 W is supplied to the coil 8 that is an example of the plasma source, thereby generating a plasma in the vacuum chamber 900, while a high-frequency power of, for example, 200 W is supplied to the sample electrode. In this way, boron was able to be introduced to a vicinity of the surface of the substrate 9.

In this case also, the in-plane distribution of sheet resistance was greatly uniformized, compared with the prior art example. This could be attributed to the reason that nonuniformity of ion density of boron, which was an example of the impurity source, due to the effects of nonuniformity of pressure, nonuniformity of flow velocity, nonuniformity of boron partial pressure, and the like as would be seen in the prior art was reduced by generating a plasma in a state in which there was no or substantially no gas flow, so that the doping process was able to be done without being affected by the gas flow.

Also, since the plasma was generated with the gas supply halted or nearly halted, there would be reaction products even near the gas inlet 11, and a thin film formed of the reaction products deposited by the gas flow would be peeled off upon resumption of the gas supply. However, in the apparatus of FIG. 6, since the gas inlet 11 was provided so as to be directed toward the pump 3, particles did not fall on the substrate 9. Further, also in the step of generating a plasma, since the gas inlet 11 was placed at a site where the gas inlet 11 would not be exposed to the plasma, there occurred almost no deposition of reaction products near the gas inlet 11 in the plasma generation, with the discharged particles dramatically reduced, so that a stabler plasma doping process was able to be carried out.

Therefore, according to the fourth embodiment, since the plasma is generated in the vacuum chamber 900 by supplying a high-frequency power to the coil 8 that is an example of the plasma source while the gas supply flow rate is set to zero (halt) or substantially zero (substantially halt) along with a setting of the gas discharge flow rate to zero (halt) or substantially zero (substantially halt), it becomes practicable to perform plasma processing without being affected by the gas flow, making it possible to enhance the processing uniformity of doping concentration and the like. Also, since the gas is supplied from the gas inlet 11 toward the turbo-molecular pump 3 that is an example of the evacuator, plasma processing can be carried out without particles (dust) falling on the silicon substrate 9 as an example of the sample.

Fifth Embodiment

A fifth embodiment of the present invention is described below with reference to FIG. 7.

FIG. 7 shows a sectional view of a plasma doping apparatus to be used in the fifth embodiment of the present invention. Referring to FIG. 7, while a specified gas is introduced into a vacuum vessel 1, which forms a vacuum chamber 900 and which is grounded, from a gas supply unit 2 via a gas inlet 11 of the vacuum vessel 1, evacuation is performed via a gas outlet 12 of the vacuum vessel 1 by a turbo-molecular pump 3 as an example of the evacuator, by which the interior of the vacuum vessel 1 can be maintained at a specified pressure by a pressure regulating valve 4. By supplying a high-frequency power of 13.56 MHz as an example by a high-frequency power supply 5 to a coil 8 provided near an outer top face of a dielectric window 7 provided at an upper portion of the vacuum vessel 1 in confrontation to a sample electrode 6, an inductively coupled plasma can be generated in an upward space and around the space of the sample electrode 6 of the vacuum chamber 900 in the vacuum vessel 1. A silicon substrate 9 as an example of the sample is placed on the sample electrode 6 set within the vacuum vessel 1 with an insulator 60 interposed.

Also, a high-frequency power supply 10 for supplying a high-frequency power to the sample electrode 6 is provided, and voltage of the sample electrode 6 can be controlled by a control unit 1000 so that the substrate 9 as an example of the sample has a negative voltage relative to the plasma.

The gas inlet 11 formed in the vacuum vessel 1 for supplying the gas from the gas supply unit 2 to the vacuum chamber 900 is provided laterally at a side portion of the vacuum vessel 1 on one side of the sample electrode 6 opposite to the gas outlet 12 (at a side portion on the left side of the sample electrode 6 in FIG. 4) in such a manner that the shortest flow passage connecting the gas outlet 12 and the gas inlet 11 of the vacuum chamber 900 to each other avoids an upward space of a surface of the silicon substrate 9 as an example of the sample (i.e., upward space of the sample electrode 6 in this fifth embodiment) and moreover a shield plate 13 as an example of a shielding member for shielding the opening of the gas inlet 11 from the sample electrode 6 side is provided.

Figure 7A:
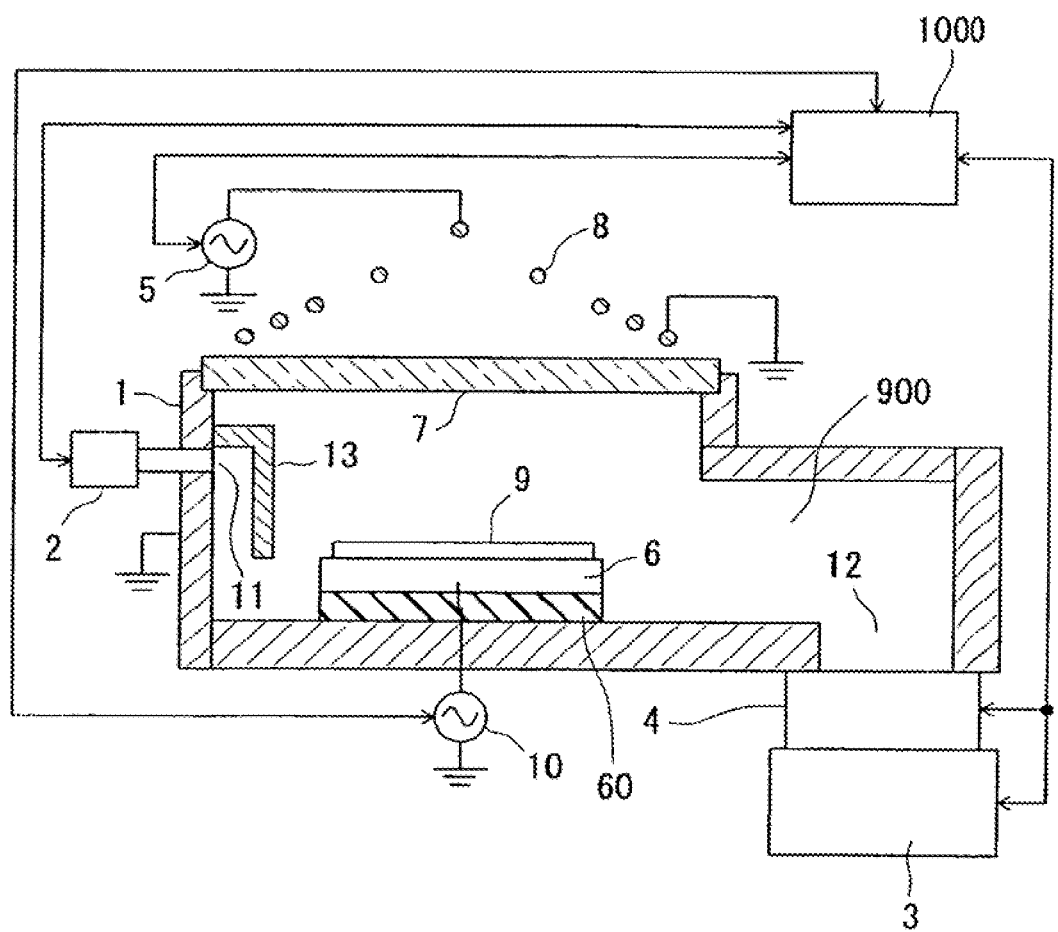
FIG. 7A is a sectional view showing a construction of a plasma doping apparatus to be used in a fifth embodiment of the present invention.
Figure 7B:
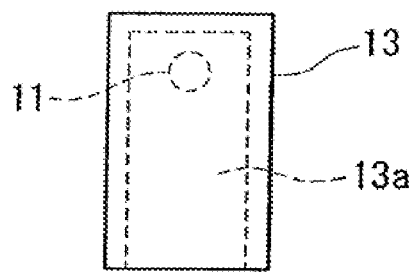
FIG. 7B is a front view of an example of a shield plate of the plasma doping apparatus to be used in the fifth embodiment of the present invention.

The shield plate 13 is a plate member which is formed of a metal material having a shielding function and not reacting with plasma and which is grounded together with the vacuum vessel 1, the plate member having such an L-shaped cross section as to protrude outward from the inner wall of the side portion of the vacuum vessel 1 and then bend downward. By this shield plate 13, the gas is guided along an inner surface opposite to the gas inlet 11 and downward. To ensure this gas guidance, the inner surface opposite to the gas inlet 11 has a recessed portion 13a as shown in FIGS. 7B to 7D so that the gas supplied from the gas inlet 11 is guided downward to around and below the sample electrode 6 by the recessed portion 13a without being directed toward a side portion of the shield plate 13. The material of the shield plate 13 may be an insulating material such as ceramics other than metals.

Accordingly, in the step of generating a plasma, the gas supplied from the gas supply unit 2 is introduced into the vacuum vessel 1 toward the pump 3 from the gas inlet 11 provided at a site where the gas inlet 11 is shielded from the plasma by the shield plate 13, and the supplied gas is guided so as to flow around and below the sample electrode 6 by the shield plate 13 without being directed toward the upward space of the sample electrode 6, and discharged from the gas outlet 12 to the pump 3.

The control unit 1000 controls operations of the gas supply unit 2, the turbo-molecular pump 3, the pressure regulating valve 4, the high-frequency power supply 5, and the high-frequency power supply 10 as shown below.

Figure 7E:
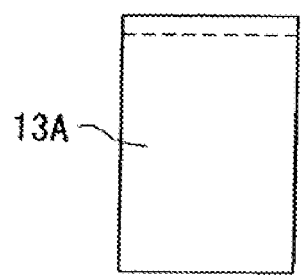
FIG. 7E is a front view of another example of the shield plate of the plasma doping apparatus to be used in the fifth embodiment.
Figure 7C:
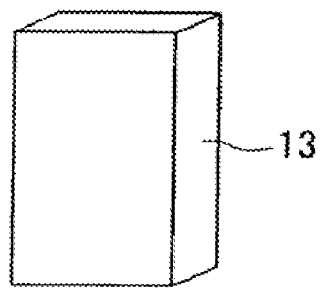
FIG. 7C is a perspective view of the example of the shield plate of the plasma doping apparatus to be used in the fifth embodiment, as viewed laterally.
Figure 7F:
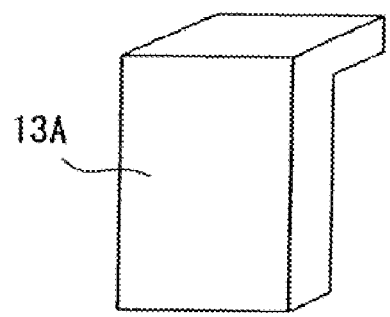
FIG. 7F is a perspective view of the another example of the shield plate of the plasma doping apparatus to be used in the fifth embodiment, as viewed laterally.
Figure 7D:
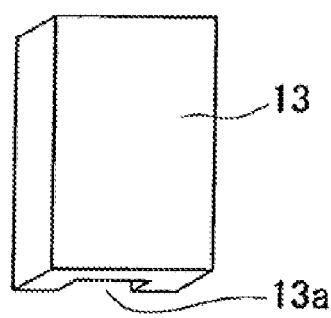
FIG. 7D is a perspective view of the example of the shield plate of the plasma doping apparatus to be used in the fifth embodiment, as viewed from below.
Figure 7G:
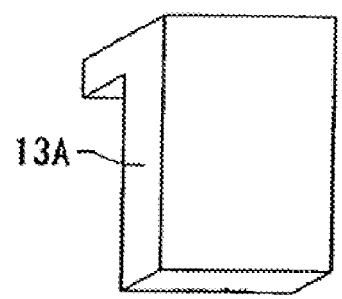
FIG. 7G is a perspective view of the another example of the shield plate of the plasma doping apparatus to be used in the fifth embodiment, as viewed from below.

In addition, another example of the shield plate 13 may be a shield plate 13A having no recessed portion 13a as shown in FIGS. 7E to 7G.

After the placing of the substrate 9 on the sample electrode 6, while the vacuum chamber 900 is evacuated through the gas outlet 12 with the sample electrode 6 held at a temperature of, for example, 10° C., 50 sccm of helium gas as an example and 3 sccm of diborane (B$_2$H$_6$) gas as an example of the doping raw material gas are supplied into the vacuum chamber 900 through the gas inlet 11, where the internal pressure of the vacuum chamber 900 is held at a pressure of, for example, 3 Pa by controlling the pressure regulating valve 4.

Next, nearly simultaneously when the evacuation is halted or nearly halted (i.e., the discharge gas flow rate is set to zero or substantially zero), gas supply is halted or nearly halted (i.e., the gas supply flow rate is set to zero or substantially zero), thereby creating a state that there is no or substantially no gas flow, i.e., a state that the mixed gas of, for example, helium gas and diborane gas is enclosed in the vacuum chamber 900 at 3 Pa.

Next, in the state that there is no or substantially no gas flow as shown above, a high-frequency power of, for example, 800 W is supplied to the coil 8 that is an example of the plasma source, thereby generating a plasma in the vacuum chamber 900, while a high-frequency power of, for example, 200 W is supplied to the sample electrode. In this way, boron was able to be introduced to a vicinity of the surface of the substrate 9.

In this case also, the in-plane distribution of sheet resistance was greatly uniformized, compared with the prior art, example. This could be attributed to the reason that nonuniformity of ion density of boron, which was an example of the impurity source, due to the effects of nonuniformity of pressure, nonuniformity of flow velocity, nonuniformity of boron partial pressure, and the like as would be seen in the prior art was reduced by generating a plasma in a state in which there was no or substantially no gas flow, so that the doping process was able to be done without being affected by the gas flow.

Also, since the plasma was generated with the gas supply halted or nearly halted, there would be deposited reaction products even near the gas inlet 11, and a thin film formed of the reaction products deposited by the gas flow would be peeled off upon resumption of the gas supply.

However, in the apparatus of FIG. 7, since the gas inlet 11 was provided at a site where the gas inlet 11 was shielded by the shield plate 13 from the plasma generated in the step of plasma generation, there occurred almost no deposition of reaction products near the gas inlet 11 in the plasma generation, with the particles dramatically reduced, so that a stabler plasma doping process was able to be carried out.

Therefore, according to the fifth embodiment, since the plasma is generated in the vacuum chamber 900 by supplying a high-frequency power to the coil 8 that is an example of the plasma source while the gas supply flow rate is set to zero (halt) or substantially zero (substantially halt) nearly simultaneously with a setting of the gas discharge flow rate to zero (halt) or substantially zero (substantially halt), it becomes practicable to perform plasma processing without being affected by the gas flow, making it possible to enhance the processing uniformity of doping concentration and the like. Also, since the gas inlet 11 is provided at the site where the gas inlet 11 is not exposed to plasma even in the step of plasma generation, plasma processing can be carried out without particles (dust) falling on the silicon substrate 9 as an example of the sample.

Figure 8:
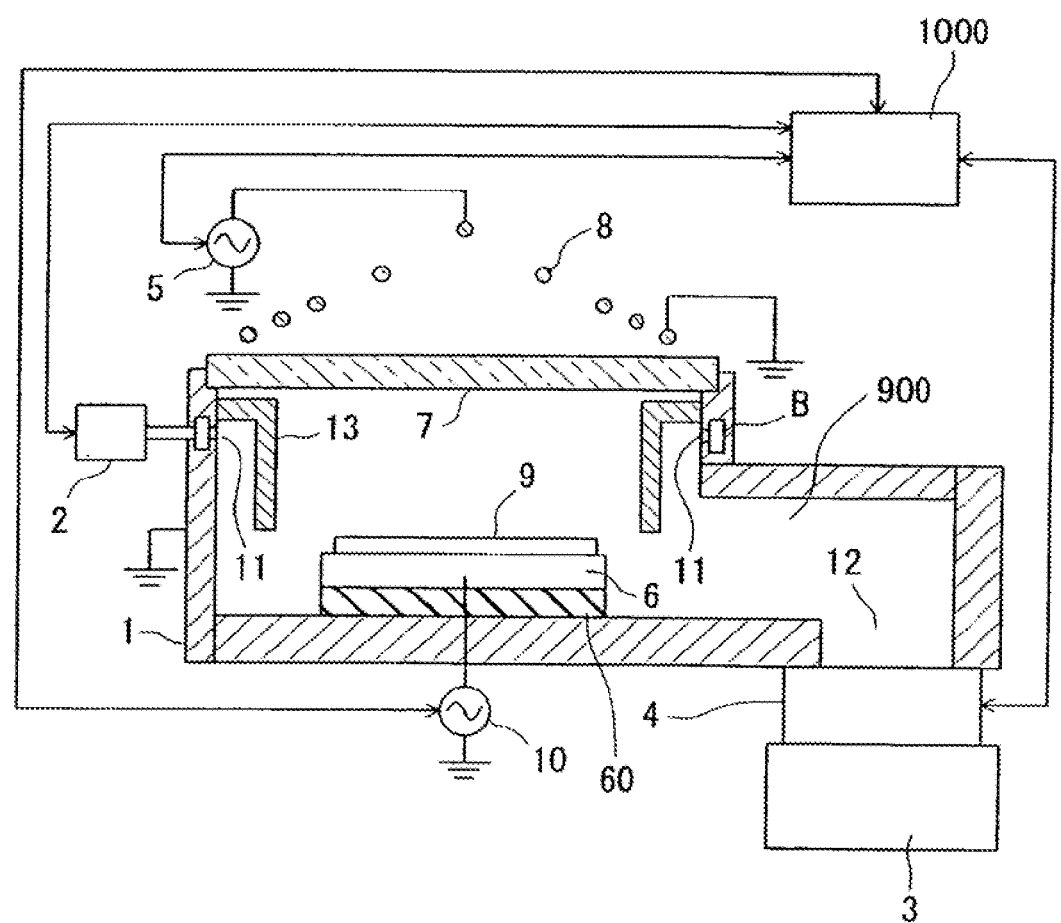
FIG. 8 is a sectional view showing a construction of a plasma doping apparatus to be used in a modification of the fifth embodiment of the present invention.

In addition, FIG. 8 shows a construction of a plasma doping apparatus to be used in a modification of the fifth embodiment of the present invention. In the plasma doping apparatus of this modification of FIG. 8, the gas inlet 11 is provided not only at one place, i.e., not only at a side portion of the vacuum vessel 1 on one side of the sample electrode 6 opposite to the gas outlet 12, but at a plurality of places on side portions of the periphery of the sample electrode 6, e.g., laterally at every 90 degrees (at every 180 degrees in FIG. 4, i.e., on the left side portion and the right side portion of the sample electrode 6), respectively, and moreover the shield plate 13 is also provided for each portion. In this case, the plurality of gas inlets 11 are communicated with each other by a gas inlet passage B which is formed so as to extend through at side portions of the vacuum vessel 1, so that gas supply or gas supply halt or nearly halt can be fulfilled simultaneously for those inlets. By doing so, the gas can be supplied concurrently from the plurality of gas inlets 11 to around the sample electrode 6, and guided to around and below the sample electrode 6 by each of the shield plates. 13 so as to be directed toward the gas outlet 12, thus making it possible to achieve more efficient gas supply.

The above-described first to fifth embodiments of the present invention have been given by way of examples on a case where gas supply is halted or nearly halted simultaneously when evacuation is halted or nearly halted so that the gas is enclosed in the vacuum vessel 1 to a specified pressure, creating a state that there is no or substantially no gas flow. However, if the halting or nearly halting of evacuation as well as the halting or nearly halting of gas supply are performed accurately with good repeatability, it is also possible that the state of no or substantially no gas flow is created by halting or nearly halting the gas supply a specified time elapse after the halting or nearly halting of the evacuation. Conversely, it is also possible that the state of no or substantially no gas flow is created by halting or nearly halting the evacuation a specified time elapse after the halting or nearly halting of the gas supply.

Otherwise, without doing simultaneously the halting or nearly halting of gas supply and evacuation, the doping process may also be carried out through the steps of, after the halting or nearly halting of evacuation of the interior of the vacuum vessel, supplying the gas from the gas inlet into the vacuum vessel for a specified time period or until the internal pressure of the vacuum vessel reaches a specified pressure, thereafter halting or nearly halting the gas supply to create a state that there is no or substantially no gas flow, and subsequently supplying a high-frequency power to the plasma source to generate a plasma in the vacuum vessel.

FIG. 9 is a view showing a condition table with a 38 lit. vacuum chamber, which is a working example of the plasma doping apparatuses to be used in the first, second, third, fourth, and fifth embodiments of the present invention.

In this working example, the gas supply and evacuation process of Step No. 1 is conditioned by a pressure of 3 Pa, a He flow rate of 50 sccm, a B$_2$H$_6$ flow rate of 3 sccm, a (V·p/Q) of 1.3 s, an ON of evacuation, and high-frequency powers (ICP/BIAS) of 0/0 (W). Then, the gas supply halting and evacuation halting process of Step No. 2 is conditioned by a pressure of 3 Pa, a He flow rate of 0 sccm, a B$_2$H$_6$ flow rate of 0 sccm, a (V·p/Q) of incomputability, an OFF of evacuation, and high-frequency powers (ICP/BIAS) of 0/0 (W). The plasma generation (plasma doping) process of Step No. 3 is conditioned by a pressure of 3 Pa, a He flow rate of 0 sccm, a B$_2$H$_6$ flow rate of 0 sccm, a (V·p/Q) of incomputability, an OFF of evacuation, and high-frequency powers (ICP/BIAS) of 800/200 (W).

FIG. 10 is a view of a condition table with a 38 lit. vacuum chamber, which is another working example of the plasma doping apparatuses to be used in the fifth embodiment of the present invention and in which evacuation is first halted and simultaneously when 4 Pa is reached, gas supply is halted.

In this working example, the gas supply and evacuation process of Step No. 1 is conditioned by a pressure of 3 Pa, a He flow rate of 100 sccm, a B$_2$H$_6$ flow rate of 6 sccm, a (V·p/Q) of 0.64 s, an ON of evacuation, and high-frequency powers (ICP/BIAS) of 0/0 (W). Then, the gas supply and evacuation halting process of Step No. 2 is conditioned by a pressure of 3 Pa, a He flow rate of 100 sccm, a $B_2H_6$ flow rate of 6 sccm, a (V·p/Q) of incomputability, an OFF of evacuation, and high-frequency powers (ICP/BIAS) of 0/0 (W). The gas supply halting and evacuation halting process of Step No. 3 is conditioned by a pressure of 4 Pa, a He flow rate of 0 sccm, a $B_2H_6$ flow rate of 0 sccm, a (V·p/Q) of incomputability, an OFF of evacuation, and high-frequency powers (ICP/BIAS) of 0/0 (W). The plasma generation (plasma doping) process of Step No. 4 is conditioned by a pressure of 4 Pa, a He flow rate of 0 sccm, a $B_2H_6$ flow rate of 0 sccm, a (V·p/Q) of incomputability, an OFF of evacuation, and high-frequency powers (ICP/BIAS) of 800/200 (W).

FIG. 11 is a view of a condition table with a 38 lit. vacuum chamber in a case which is yet another concrete working example of the plasma doping apparatus to be used in the fifth embodiment of the present invention and in which gas supply is first halted and simultaneously when 2 Pa is reached, evacuation is halted.

In this working example, the gas supply and evacuation process of Step No. 1 is conditioned by a pressure of 3 Pa, a He flow rate of 198 sccm, a $B_2H_6$ flow rate of 2 sccm, a (V·p/Q) of 0.34 s, an ON of evacuations and high-frequency powers (ICP/BIAS) of 0/0 (W). Then, the gas supply halting and evacuation process of Step No. 2 is conditioned by a pressure of 3 Pa, a He flow rate of 0 sccm, a $B_2H_6$ flow rate of 0 sccm, a (V·p/Q) of incomputability, an ON of evacuation, and high-frequency powers (ICP/BIAS) of 0/0 (W). The gas supply halting and evacuation halting process of Step No. 3 is conditioned by a pressure of 2 Pa, a He flow rate of 0 sccm, a $B_2H_6$ flow rate of 0 sccm, a (V·p/Q) of incomputability, an OFF of evacuation, and high-frequency powers (ICP/BIAS) of 0/0 (W). The plasma generation (plasma doping) process of Step No. 4 is conditioned by a pressure of 2 Pa, a He flow rate of 0 sccm, a $B_2H_6$ flow rate of 0 sccm, a (V·p/Q) of incomputability, an OFF of evacuations and high-frequency powers (ICP/BIAS) of 800/200 (W).

Sixth Embodiment

A sixth embodiment of the present invention is described below. In the sixth embodiment of the present invention, a plasma processing apparatus similar to that of FIG. 13 used in the prior art example is used.

Figure 12A:
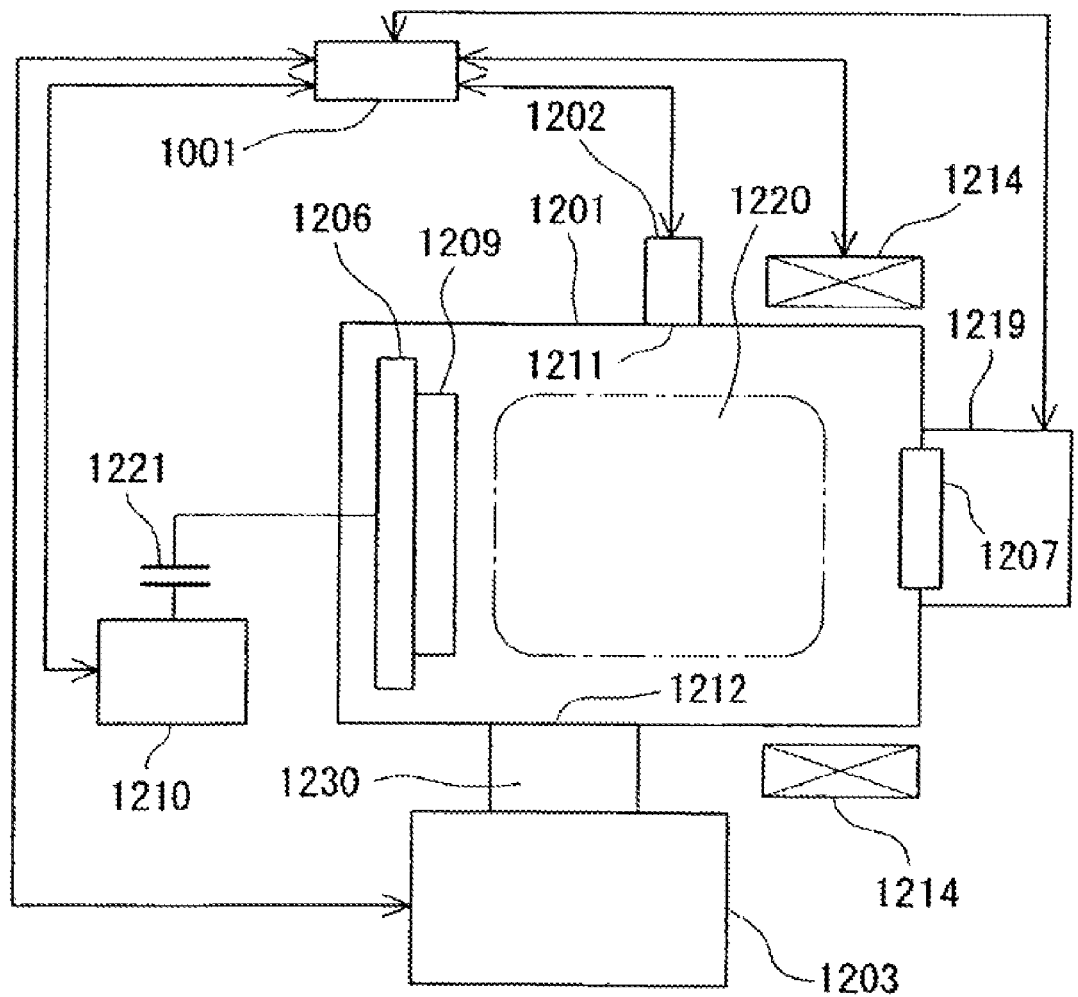
FIG. 12A is a sectional view showing a construction of a plasma doping apparatus to be used in a sixth embodiment of the present invention.
Figure 13:
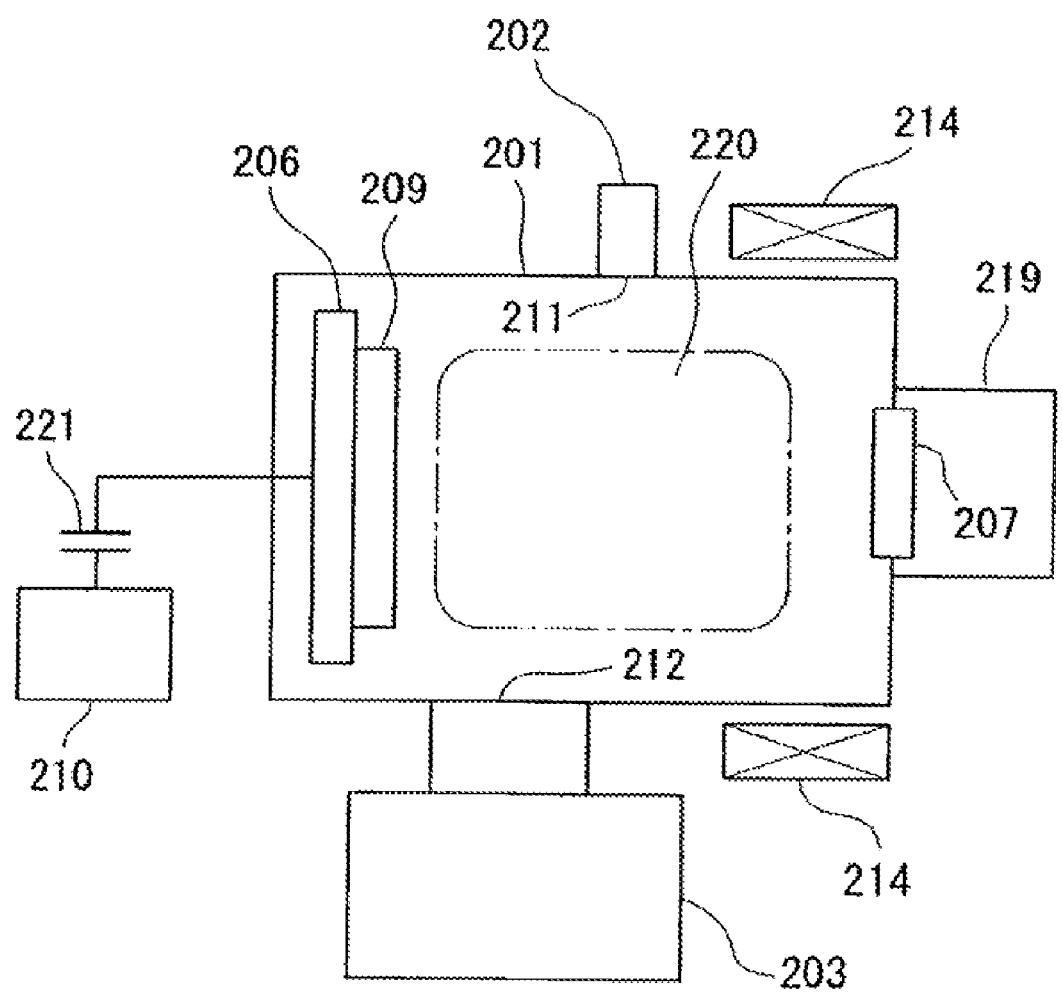
FIG. 13 is a sectional view showing a construction of a plasma doping apparatus to be used in a prior art.
Figure 14:
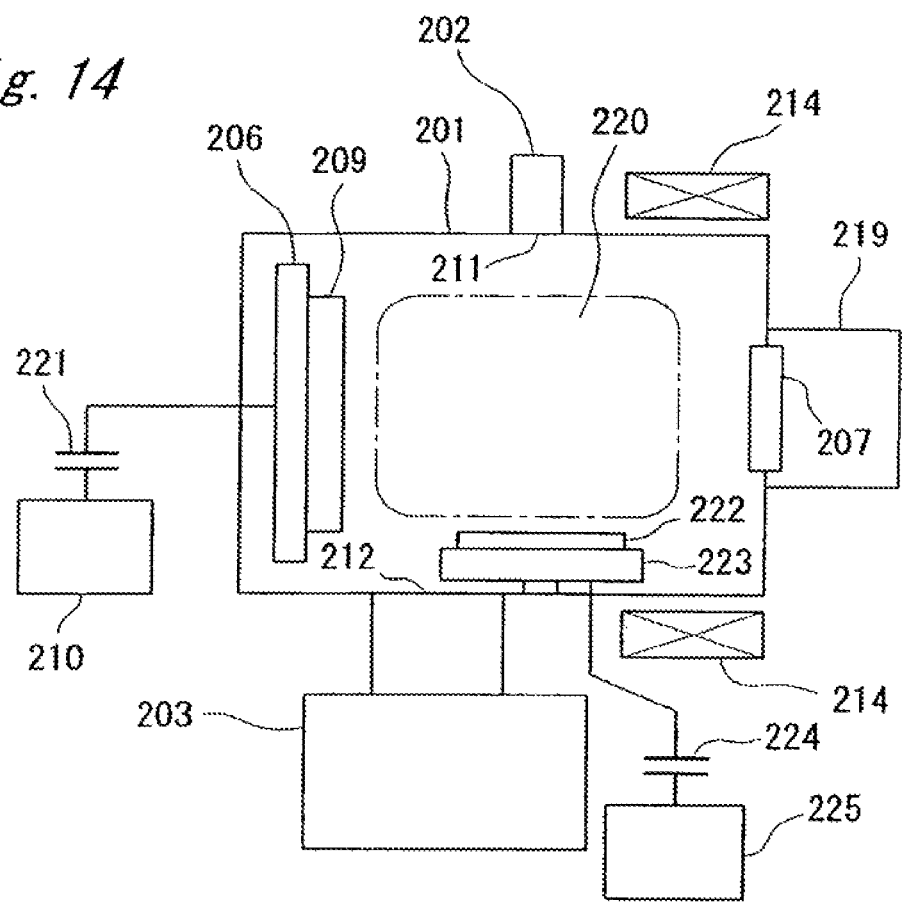
FIG. 14 is a sectional view showing a construction of a plasma doping apparatus to be used in a prior art.
Figure 15:
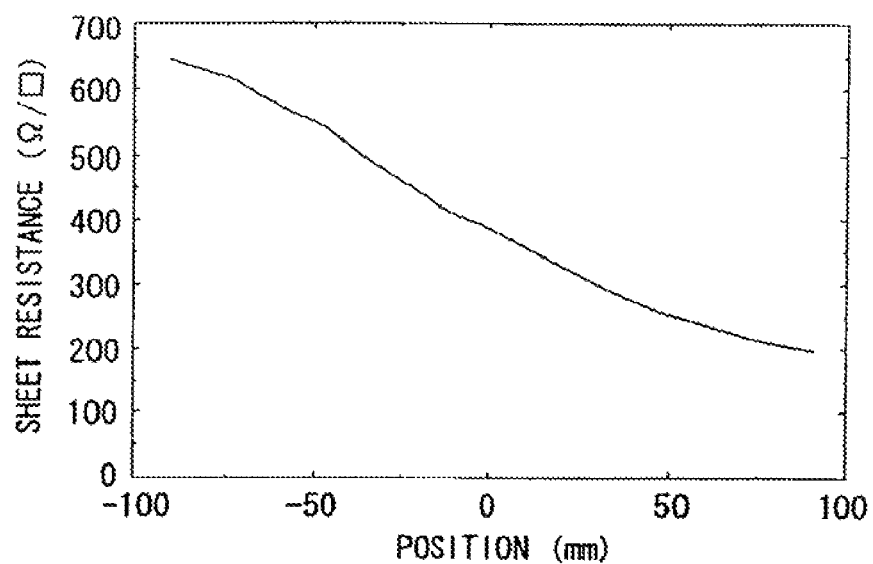
FIG. 15 is a view showing sheet resistance measurement results in the prior art.

FIG. 12A shows an outlined construction of the plasma doping apparatus similar to the conventional plasma processing apparatus of FIG. 13. Referring to FIG. 12A, a sample electrode 1206 for placing thereon a sample 1209 formed of a silicon substrate is provided in a vacuum chamber 1201. In the vacuum chamber 1201 are provided a gas supply unit 1202 for supplying a doping raw material gas containing desired elements, e.g., $B_2H_6$, and a pump 1203 for pressure-reducing the interior of the vacuum chamber 1201, by which the interior of the vacuum chamber 1201 can be maintained at a specified pressure. From a microwaveguide 1219, a microwave is radiated into the vacuum chamber 1201 via a quartz plate 1207 as a dielectric window. By interaction of this microwave and a dc magnetic field formed from an electromagnet 1214, an effective-magnetic-field microwave plasma (electron cyclotron resonance plasma) 1220 is formed in the vacuum chamber 1201. A high-frequency power supply 1210 is connected to the sample electrode 1206 via a capacitor 1221 so that voltage of the sample electrode 1206 can be controlled. It is noted that the gas supplied from the gas supply unit 1202 is introduced into the vacuum chamber 1201 through a gas inlet 1211, and discharged to the pump 1203 through a gas outlet 1212.

In a plasma processing apparatus of such a constitution, a doping raw material gas, e.g., $B_2H_6$, introduced through the gas inlet 1211 is formed into a plasma by a plasma generation means composed of the microwaveguide 1219 and the electromagnet 1214, and boron ions in the plasma 1220 are introduced to a surface of a sample 1209 by the high-frequency power supply 1210.

On the sample 1209 to which impurities have been introduced in this way, forming a metal interconnection layer, then forming a thin oxide film on the metal interconnection layer in a specified oxidizing atmosphere, and thereafter forming gate electrodes on the sample 1209 by a CVD device or the like allows, for example, MOS transistors to be obtained.

After the placing of the substrate 1209 on the sample electrode 1206, while the vacuum chamber 1201 is evacuated through the gas outlet 1212 with the sample electrode 1206 held at a temperature of, for example, 10.degree. C., 7 sccm of helium gas as an example and 3 sccm of diborane ($B_2H_6$) gas as an example of the doping raw material gas are supplied to the vacuum chamber 1201 through the gas inlet 1211, where the vacuum chamber 1201 is held at a pressure of, for example, 3 Pa by controlling a pressure regulating valve 1230. Under this state, as an example of the plasma source, a microwave is radiated from the microwaveguide 1219 into the vacuum chamber 1201 via the quartz plate 1207 as a dielectric window. By interaction of this microwave and a dc magnetic field formed from the electromagnet 1214, an effective-magnetic-field microwave plasma (electron cyclotron resonance plasma) 1220 is formed in the vacuum chamber 1201, and moreover a high-frequency power of, for example, 200 W is supplied to the sample electrode 1206. In this way, boron was able to be introduced to a vicinity of a surface of the substrate 1209.

In this case, the in-plane distribution of sheet resistance was greatly uniformized, compared with the prior art example. This could be attributed to the reason that nonuniformity of ion density of boron, which was an example of the impurity source, due to the effects of nonuniformity of pressure, nonuniformity of flow velocity, nonuniformity of boron partial pressure, and the like as would be seen in the prior art was reduced so that the doping process was able to be carried out while the doping process was little affected by the gas flow because of an extremely small gas supply quantity (it can be regarded as a halt state of a substantially 0 gas supply quantity), though there was a slight gas flow.

An average residence time of the gas in the vacuum chamber 1201 under these conditions was calculated. The residence time can be expressed by an equation of V·p/Q (in the unit of s), where the volume of the vacuum chamber 1201 is V (L: liter), the internal pressure of the vacuum chamber 1201 is p (Torr), and the gas flow rate is Q (Torr·L/s). In these conditions, since V=38 (L), p=3 (Pa)=0.023 (Torr), and Q=7+3 (sccm)=10 (sccm)=0.13 (Torr·L/s), the residence time is V·p/Q=6.7 (s).

Then, as a result of evaluating the in-plane distribution of sheet resistance under various conditions, it has been found that if the relation of V·p/Q>1 (s) is satisfied, then the in-plane distribution of sheet resistance becomes less than ±10%, showing successful results. Further, in the step of generating a plasma, if the relation of V·p/Q>5 (s), then the in-plane distribution of sheet resistance becomes less than ±5%, showing more successful results.

Although the increasingly larger values of V·p/Q are preferred in terms of uniformity, values that are too large may become disadvantageous in other terms. That is, an increase in V leads to an increase in the price of the vacuum vessel as well as an increase in the apparatus installation area. An increase in p and a decrease in Q cause disadvantages of increased mixing of impurities other than desired impurities (e.g., constituent elements of the vacuum vessel) in addition to an increased time required until reaching a specified pressure. Accordingly, values of V·p/Q generally not more than 20 s are preferable.

With this constitution, in a state that the gas discharge flow rate is set to substantially zero (substantially halt) and the gas supply flow rate is set to substantially zero (substantially halt) by setting the V·p/Q to about not more than 20 s, a plasma is generated in the vacuum chamber 900 by supplying a high-frequency power to the coil 8 that is an example of the plasma source. Thus, it becomes practicable to perform plasma processing without being affected by the gas flow, making it possible to enhance the processing uniformity of doping concentration and the like. Also, since the gas supply is not halted, reaction products are less likely to be deposited to vicinities of the gas inlet 11 during the plasma generation (i.e., because the plasma is generated while the gas is supplied through the gas inlet 11, vicinities of the gas inlet 11 are high in pressure and high in flow velocity locally so that quite a low plasma density results in making it less likely that reaction products are deposited near the gas inlet 11). Therefore, plasma processing can be carried out without particles (dust) falling on the silicon substrate 9 as an example of the sample.

FIG. 12B is a view showing a condition table with a 38 lit. vacuum chamber, which is a working example of plasma doping processes to be performed with a plasma doping apparatus to be used in the sixth embodiment of the present invention.

In this working example, the gas supply and evacuation process of Step No. 1 is conditioned by a pressure of 3 Pa, a He flow rate of 7 sccm, a $B_2H_6$ flow rate of 3 sccm, a (V·p/Q) of 6.7 s, an ON of evacuation, and high-frequency powers (ICP/BIAS) of 0/0 (W). Then, the gas supply and evacuation process of Step No. 2 is conditioned by a pressure of 3 Pa, a He flow rate of 7 sccm, a $B_2H_6$ flow rate of 3 sccm, a (V·p/Q) of 6.7 s, an ON of evacuation, and high-frequency powers (ICP/BIAS) of 800/200 (W).

The above-described various embodiments of the present invention are given by way of examples only as a part of many variations as to the configuration of the vacuum vessel (vacuum chamber), the method and arrangement of the plasma source, and the like within the applicable scope of the present invention. In applying the present invention, needless to say, many variations are also possible in addition to the above-described examples.

For example, the coil 8 may be planar-shaped, or a helicon wave plasma source, a magnetic neutral loop plasma source, or an effective-magnetic-field microwave plasma source (electron cyclotron resonance plasma source) may be used, or a parallel-plate plasma source may be used.

Further, inert gases other than helium may be used, where at least one among neon, argon, krypton, and xenon is usable as gas. These inert gases have an advantage of being lesser in adverse effects on the sample than other gases.

Also, although there have been given examples in which the sample is a semiconductor substrate formed of silicon, the present invention is applicable to processing of samples of other various materials.

Also, although there have been given examples in which the impurity is boron, the present invention is effective in a case where the sample is a semiconductor substrate formed of silicon, particularly to cases where the impurity is arsenic, phosphorus, boron, aluminum, or antimony. This is because shallow junctions can be formed at transistor portions.

Also, the present invention is effective to cases where the doping concentration is low, and particularly effective as a plasma doping method aimed at $1\times10^{11}/cm^2$ to $1\times10^{17}/cm^2$. The present invention produces great effects, in particular, as a method aimed at doping concentrations of $1\times10^{11}/cm^2$ to $1\times10^{14}/cm^2$. Whereas conventional ion implantation is usefully applicable to cases where the doping concentration is higher than $1\times10^{17}/cm^2$, devices that require a doping concentration of not more than $1\times10^{17}/cm^2$ would not be implementable by conventional methods, but do become implementable by the present invention.

Also, although there have been given examples in which the internal pressure of the vacuum vessel is 3 Pa in the step of generating a plasma, the internal pressure of the vacuum vessel in the step of generating a plasma is preferably 0.01 Pa to 5 Pa. Too low a pressure (i.e., a pressure of less than 0.01 Pa) would cause a disadvantage of deterioration of the gas enclosure precision. Conversely, too high a pressure (i.e., a pressure beyond 5 Pa) would make it hard to generate a sufficient self-bias voltage in the substrate. More preferably, the internal pressure of the vacuum vessel in the step of generating a plasma is desirably 0.1 to 1 Pa. Pressures in such a range of 0.1 to 1 Pa allow the enclosure precision to become higher and the self-bias controllability to become better.

Also, although there have been given examples in which the gas to be supplied into the vacuum vessel is a gas containing a doping raw material, the present invention is effective to cases where the gas to be supplied into the vacuum vessel does not contain a doping raw material and the doping raw material gas is generated from a solid impurity.

Also, although there have been given examples of plasma doping, the present invention is also applicable to other plasma processing including dry etching, ashing, plasma CVD, and the like.

By properly combining the arbitrary embodiments of the aforementioned various embodiments, the effects possessed by the embodiments can be produced.

The plasma processing method and apparatus of the present invention are capable of enhancing the processing uniformity of the doping concentration and the like without causing occurrence of particles (dust), and also applicable to uses in the impurity doping process of semiconductors, the manufacture of thin-film transistors to be used for liquid crystals, the surface reforming of various materials, and the like. Furthermore, the present invention is applicable to other plasma processing including dry etching, ashing, plasma CVD, and the like.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method for introducing impurities into a sample or a film of a surface of the sample, the plasma processing method comprising:

placing the sample on a sample electrode within a vacuum chamber;

evacuating an interior of the vacuum chamber through a gas outlet of the vacuum chamber;

after setting a gas exhaust flow rate from within the vacuum chamber through the gas outlet to zero, supplying gas into the vacuum chamber from a gas inlet which is so provided that a shortest flow passage connecting the gas outlet and the gas inlet of the vacuum chamber to each other avoids an upward space of the sample surface, by which a flow of the gas supplied into the vacuum chamber from the gas inlet of the vacuum chamber is directed toward the gas outlet while avoiding the upward space of the sample surface;

setting a supply flow rate of the gas from the gas inlet to zero; and supplying a high-frequency power to a plasma source to generate a plasma in the vacuum chamber, thereby introducing the impurities into the sample or the film of the sample surface.

2. The plasma processing method as claimed in claim 1, wherein in, after setting the gas exhaust flow rate from within the vacuum chamber through the gas outlet to zero, the supplying of the gas into the vacuum chamber from the gas inlet comprises supplying the gas into the vacuum chamber from the gas inlet provided at a site closer to the gas outlet than to the sample electrode.

3. The plasma processing method as claimed in claim 1, wherein in, after setting the gas exhaust flow rate from within the vacuum chamber through the gas outlet to zero, the supplying of the gas into the vacuum chamber from the gas inlet comprises supplying the gas into the vacuum chamber from the gas inlet provided at a site lower than the sample electrode.

4. The plasma processing method as claimed in claim 1, wherein in, after setting the gas exhaust flow rate from within the vacuum chamber through the gas outlet to zero, the supplying of the gas into the vacuum chamber from the gas inlet comprises supplying the gas from the gas inlet toward the gas outlet.

5. The plasma processing method as claimed in claim 1, wherein in, after setting the gas exhaust flow rate from within the vacuum chamber through the gas outlet to zero, the supplying of the gas into the vacuum chamber from the gas inlet comprises supplying the gas from the gas inlet toward an evacuator for performing the evacuation.

6. The plasma processing method as claimed in claim 1, wherein in, while the evacuation is performed, the supplying of the gas into the vacuum chamber from the gas inlet comprises supplying the gas into the vacuum chamber from the gas inlet provided at a site which is not exposed to the plasma even when the plasma is generated.

7. The plasma processing method as claimed in claim 1, wherein in, after setting the gas exhaust flow rate from within the vacuum chamber through the gas outlet to zero, the supplying of the gas into the vacuum chamber from the gas inlet comprises supplying the gas into the vacuum chamber from the gas inlet provided at a site where the gas inlet is shielded from the plasma by a shield plate when the plasma is generated.

* * * * *